United States Patent
Matsuda et al.

[11] Patent Number: 6,114,927
[45] Date of Patent: *Sep. 5, 2000

[54] SURFACE ACOUSTIC WAVE FILTER UTILIZING DIRECTION CHANGING ELECTRODES AND A WEIGHTED TRANSDUCER

[75] Inventors: Takashi Matsuda; Jun Tsutsumi; Osamu Ikata; Yoshio Satoh, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/172,239

[22] Filed: Oct. 14, 1998

[30] Foreign Application Priority Data

Jun. 19, 1998 [JP] Japan .................. 10-173364

[51] Int. Cl.$^7$ .................................................. H03H 9/64
[52] U.S. Cl. .......................................... 333/195; 333/196
[58] Field of Search ............................. 333/193–196; 310/313 B, 313 C, 313 D

[56] References Cited

U.S. PATENT DOCUMENTS

| | | | |
|---|---|---|---|
| 4,114,119 | 9/1978 | Sandy et al. | 333/196 X |
| 4,166,987 | 9/1979 | Coldren | 333/193 X |
| 4,237,433 | 12/1980 | Tanski | 333/195 |
| 4,309,679 | 1/1982 | Furuya et al. | 333/195 |
| 4,325,038 | 4/1982 | Coldren | 333/195 |
| 4,591,815 | 5/1986 | Schofield | 333/195 |
| 4,659,955 | 4/1987 | Schofield | 333/195 X |
| 4,661,738 | 4/1987 | Skeie | 333/195 X |
| 4,727,275 | 2/1988 | Milsom | 333/195 X |
| 5,365,206 | 11/1994 | Machui et al. | 333/195 |

FOREIGN PATENT DOCUMENTS 9-153765  6/1997  Japan .

*Primary Examiner*—Robert Pascal
*Assistant Examiner*—Barbara Summons
*Attorney, Agent, or Firm*—Staas & Halsey

[57] ABSTRACT

A surface acoustic wave filter includes a piezoelectric substrate, input and output IDTs, and first and second direction changing electrodes, wherein at least one of the input and output IDTs includes a weighted interdigital transducer, the input and output IDTS being arranged in a direction perpendicular to a propagation direction of a surface acoustic wave (SAW) oscillated by the input IDT. The first direction changing electrode changes the propagation direction of the SAW, which has propagated in a left directed from the input IDT, into a direction towards the output IDT. The second direction changing electrode changes the propagation direction of the SAW, which has propagated in a right direction from the input IDT, into a direction towards the output IDTs and the first and second direction changing electrodes is set for obtaining at the output IDT the SAW having desired frequency characteristics.

6 Claims, 24 Drawing Sheets

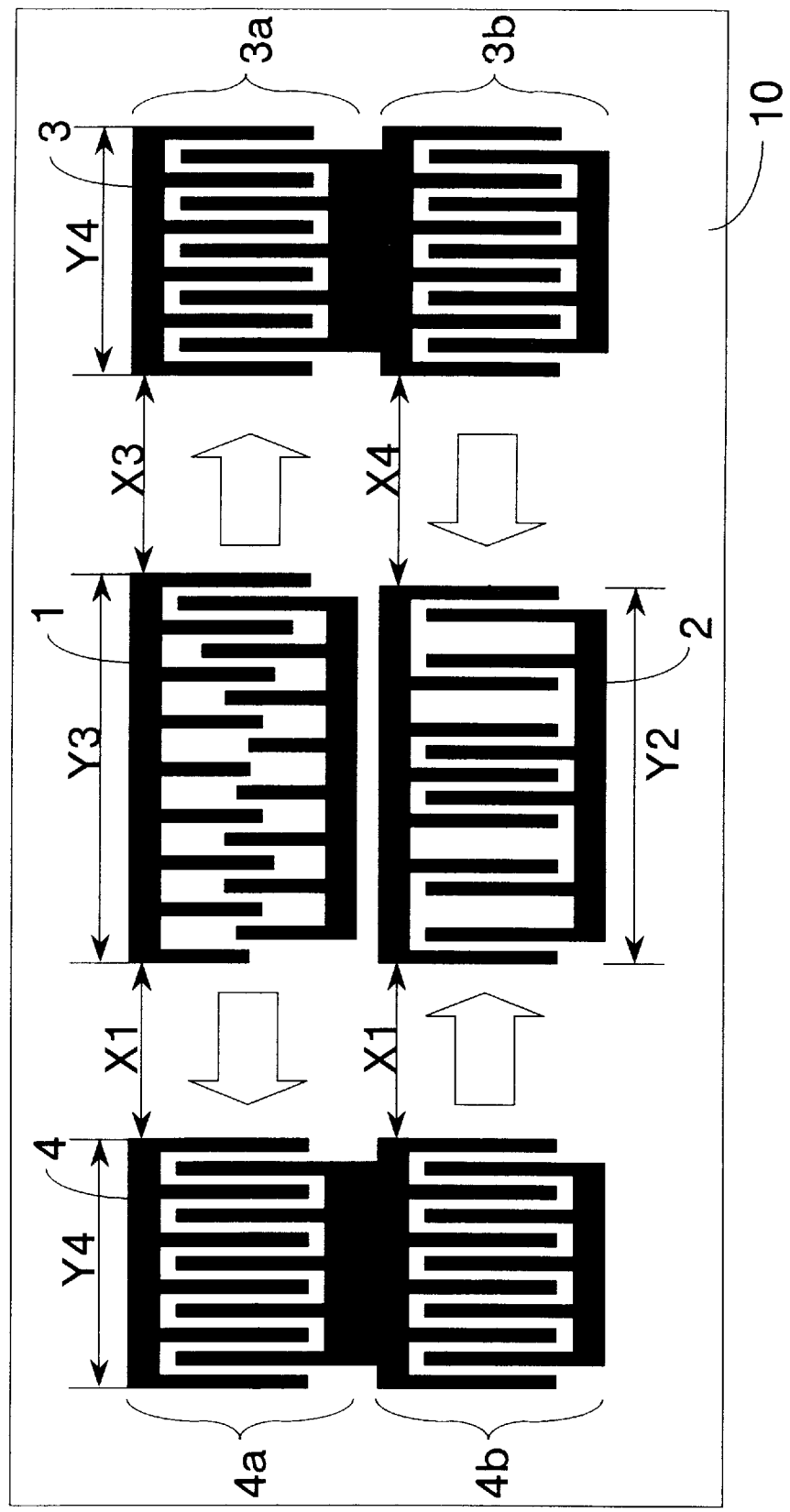

SAW INCIDENT INTO THE
OUTPUT ELECTRODE AT
THE TIME DELAYED BY T1

SAW INCIDENT INTO THE
OUTPUT ELECTRODE AT
THE TIME DELAYED BY T2

SAW OBTAINED BY SYNTHESIS
AT THE OUTPUT ELECTRODE

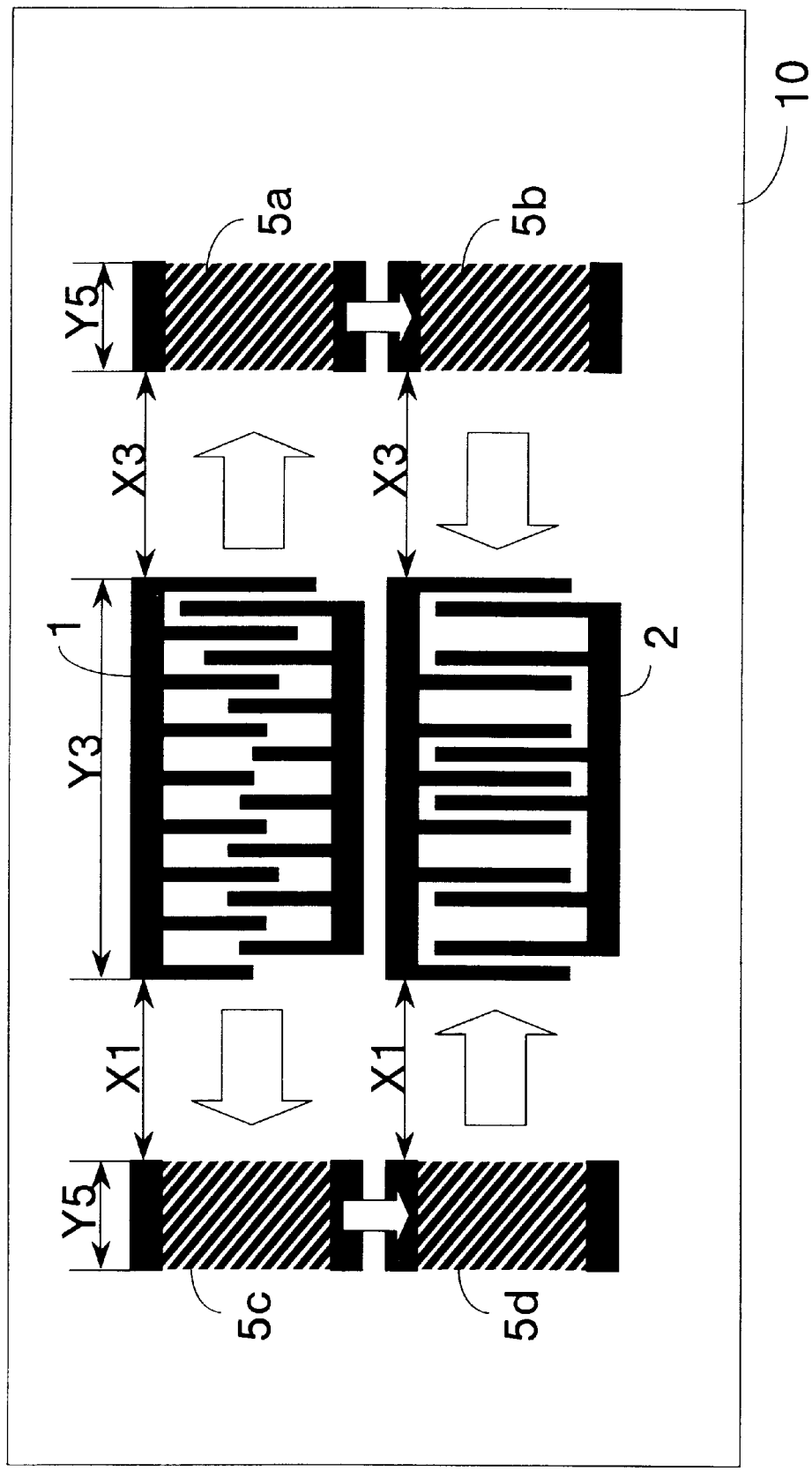

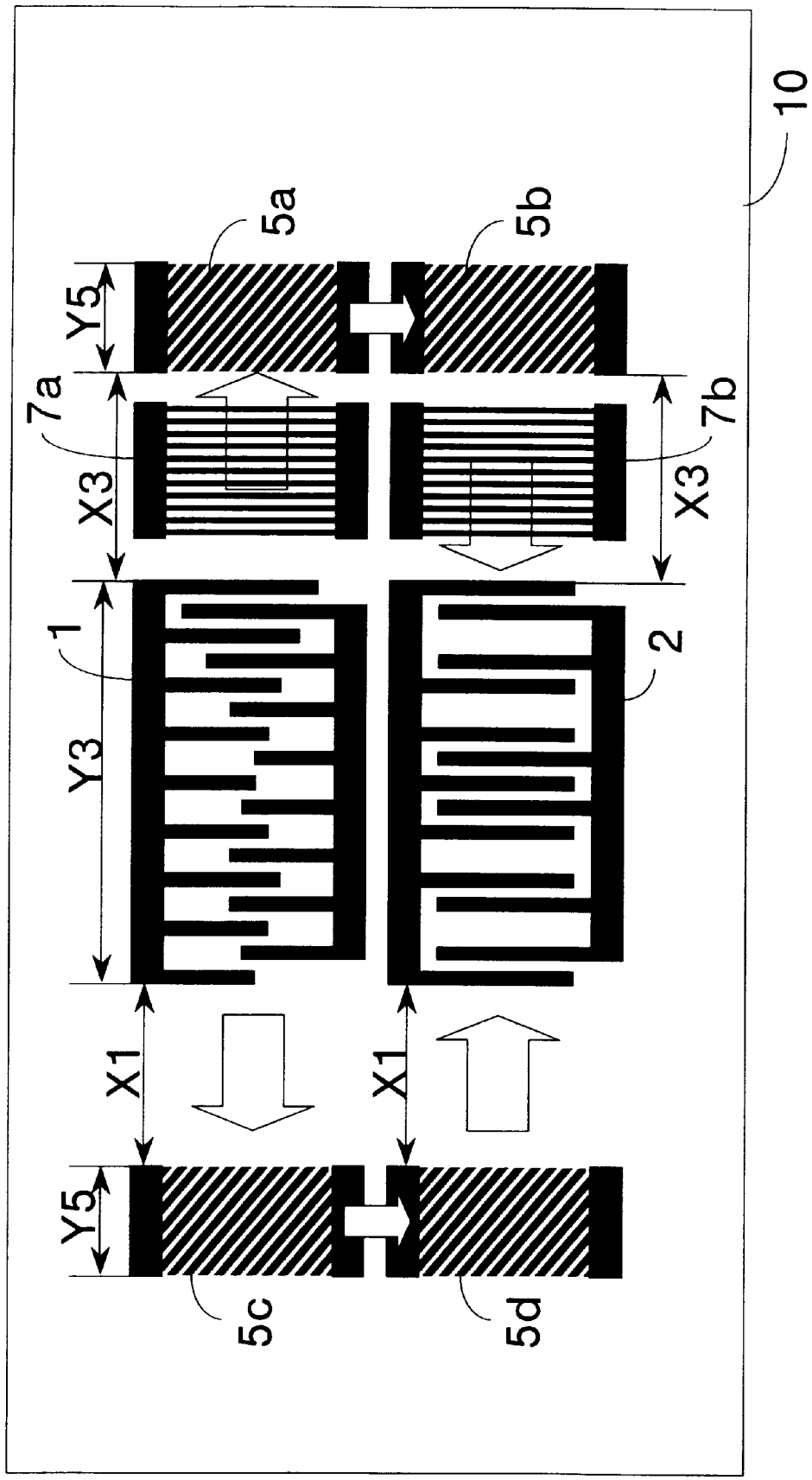

6 ELECTRODE FINGER OF THE REFLECTOR

—— EXAMPLE OF THE PRIOT ART
—— EXAMPLE OF
THE PRESENT INVENTION

— EXAMPLE OF THE PRIOT ART
— EXAMPLE OF THE PRESENT INVENTION

SAW INCIDENT INTO THE
OUTPUT ELECTRODE AT
THE TIME DELAYED BY T1

SAW INCIDENT INTO THE
OUTPUT ELECTRODE AT
THE TIME DELAYED BY T1

SAW OBTAINED BY SYNTHESIS
AT THE OUTPUT ELECTRODE

SURFACE ACOUSTIC WAVE FILTER UTILIZING DIRECTION CHANGING ELECTRODES AND A WEIGHTED TRANSDUCER

CROSS-REFERENCES TO RELATED APPLICATIONS

This application is related to Japanese patent application No. HEI 10-173364 filed on Jun. 19, 1998 whose priority is claimed under 35 USC §119, the disclosure of which is incorporated herein by reference in its entirety.

BACKGROUND OF THE INVENTION

1. Field of the Invention

The present invention relates to a surface acoustic wave filter and more particularly to a surface acoustic wave filter in which an input IDT (Interdigital transducer) and an output IDT are arranged in a direction perpendicular to an oscillation direction of a surface acoustic wave.

2. Description of the Related Art

Today, in accordance with scale reduction of communication apparatus such as a portable telephone, scale reduction of electronic components used in the apparatus is strongly desired. Especially, a surface acoustic wave filter used in a duplexer is prevalently used in portable telephones because it is advantageous in terms of its sharp frequency characteristics and scale reduction of the apparatus.

A surface acoustic wave filter includes an input IDT for receiving an electric signal to oscillate a surface acoustic wave and an output IDT for receiving the oscillated surface acoustic wave to output an electric signal. As the input IDT and the output IDT, interdigital electrodes (comb-like electrodes) obtained by a combination of elongated electrode fingers are used.

Also, for surface acoustic wave filters requiring sharp characteristics such as IF filters, interdigital transducers with weighting, such as apodized and withdrawal, have been used both as the input IDT and the output IDT. The amount of weighting the electrodes such as the number of electrode pairs is usually determined by filter characteristics such as a bandpass width. Accordingly as the required filter characteristics are sharper, the amount of weighting the electrodes, i.e. the number of electrode pairs, increases, so that the size of the interdigital transducers increases and hence the filter size itself in the oscillation direction of the surface acoustic wave increases.

FIGS. 18 and 19 show constructions of conventional surface acoustic wave filters. FIG. 18 shows a surface acoustic wave filter obtained by a combination of an apodized IDT 31 and a uniform IDT 32. FIG. 19 shows a surface acoustic wave filter obtained by a combination of an apodized IDT 31 and a withdrawal IDT 33.

Assuming that the apodized IDT 31 is the input IDT, a surface acoustic wave is oscillated between its electrode fingers in the right-and-left direction of the paper sheet and propagates in the right and left directions from the apodized IDT 31. In FIGS. 18 and 19, the surface acoustic wave propagating in the right direction from the apodized IDT 31 enters the output IDT which is the uniform IDT 32 or the withdrawal IDT 33.

In the conventional constructions shown in FIGS. 18 and 19, it is required that the number of electrode pairs in the apodized IDT 31 is about 1000 and the number of electrode pairs in the withdrawal IDT 33 or the uniform IDT 32 is about 400 in order to satisfy the characteristics required as an IF filter, although they depend on the specification of the filter.

Also, Japanese Unexamined Patent Publication No. HEI 9 (1997)-153765 discloses a SAW filter comprising four electrodes forming a multistrip coupler which are each bent in the shape of a crank and mutually cross at the intermediate section through insulating films, an input transducer and an output transducer, the input transducer and the output transducer being respectively arranged above and under the crossing sections of the four electrodes on the left or right side of the multistrip coupler.

However, in the case where an apodized IDT having as many as 1000 pairs of electrode fingers is used, the filter size in the oscillation direction of the surface acoustic wave increases considerably, rendering it impossible to meet the needs for further size reduction.

Also, in Japanese Unexamined Patent Publication No. HEI 9(1997)-153765, the apodized IDTs used as the input IDT and the output IDT require about 1000 pairs of electrode fingers, so that a further size reduction is difficult. Moreover, since the filter is provided with a structure in which a multi-strip coupler crosses over in three dimensions, the fabrication process has been difficult.

Further, in order to reduce the size of the surface acoustic wave filter, the number of electrode pairs (i.e. the amount of weighting the electrodes) must be reduced. However, desired frequency characteristics such as required in IF filters cannot be obtained if the amount of weighting the electrodes only is reduced in a simple manner.

SUMMARY OF THE INVENTION

The present invention provides a surface acoustic wave filter including a piezoelectric substrate, at least one input IDT and at least one output IDT formed on the piezoelectric substrate, and first and second direction changing electrodes, wherein at least one of the input and output IDTs includes a weighted interdigital transducer, the input and output IDTs being arranged in a direction perpendicular to a propagation direction of a surface acoustic wave oscillated by the input IDT; the first direction changing electrodes is an electrode disposed at left sides of the input and output IDTs for changing the propagation direction of the surface acoustic wave, which has propagated in a left direction from the input IDT, into a direction towards the output IDT; the second direction changing electrode is an electrode disposed at right sides of the input and output IDTs for changing the propagation direction of the surface acoustic wave, which has propagated in a right direction from the input IDT, into a direction towards the output IDT; the weighted interdigital transducer includes a portion of an electrode having a weighting means required for realizing desired frequency characteristics as a surface acoustic wave filter, the portion of the weighted interdigital transducer including a central portion which has the largest weight amount of the required weighting means and including A% or more of the weighting means (50≦A≦100) and an interval between the input and output IDTs and the first and second direction changing electrodes is set for time-delaying the surface acoustic wave so that a surface acoustic wave to be generated by the electrode of the weighting means which has not been included in the weighted interdigital transducer is contained, and for obtaining at the output IDT the surface acoustic wave having the desired frequency characteristics.

According to the surface acoustic wave filter of the present invention having the above-mentioned construction, the size of the surface acoustic wave filter is reduced while maintaining the desired frequency characteristics of the filter or increasing the loss outside the passband in the frequency characteristics.

BRIEF DESCRIPTION OF THE DRAWINGS

The present invention will be better understood from the following detailed description of preferred embodiments of the invention, taken in conjunction with the accompanying drawings, in which:

FIG. 1 is a view showing a construction of a surface acoustic wave filter according to the present invention;

FIG. 3 is a view showing a construction of a surface acoustic wave filter according to the present invention;

FIG. 4 is a view showing a construction of a surface acoustic wave filter according to the present invention;

DETAILED DESCRIPTION OF THE PREFERRED EMBODIMENTS

The purpose of the present invention is to provide a small-size surface acoustic wave filter by which the desired frequency characteristics for the surface acoustic wave filters can be obtained even if the amount of weighting the electrodes in the input IDT and the output IDT is reduced.

Here, each of the first and second direction changing electrodes may include an interdigital transducer. In this case, a portion of the surface acoustic wave (hereafter referred to as "SAW") exiting in the right and left directions from the input IDT changes its direction.

Especially, the first and second direction changing electrodes may include two connected interdigital transducers arranged in two stages in a direction perpendicular to the propagation direction of the SAW oscillated by the input IDT.

Also, the first and second direction changing electrodes may include first and second reflectors arranged in two stages in a direction perpendicular to the propagation direction of the SAW oscillated by the input IDT, the first reflector changing the propagation direction of the SAW, which has been emitted from the input IDT, into a direction towards the second reflector, the second reflector changing the propagation direction of the SAW, which has been received from the first reflector, into a direction towards the output IDT.

FIG. 1 is a view showing a construction of a SAW filter according to the present invention. Referring to FIG. 1, it is assumed that an input IDT 1 is an apodized IDT and an output IDT 2 is a withdrawal IDT. The input IDT 1 and the output IDT 2 are arranged in a direction (the up-and-down direction of the paper sheet) which is perpendicular to a propagation direction (the right-and-left direction of the paper sheet) of a SAW oscillated by the input IDT 1.

Figure 18:
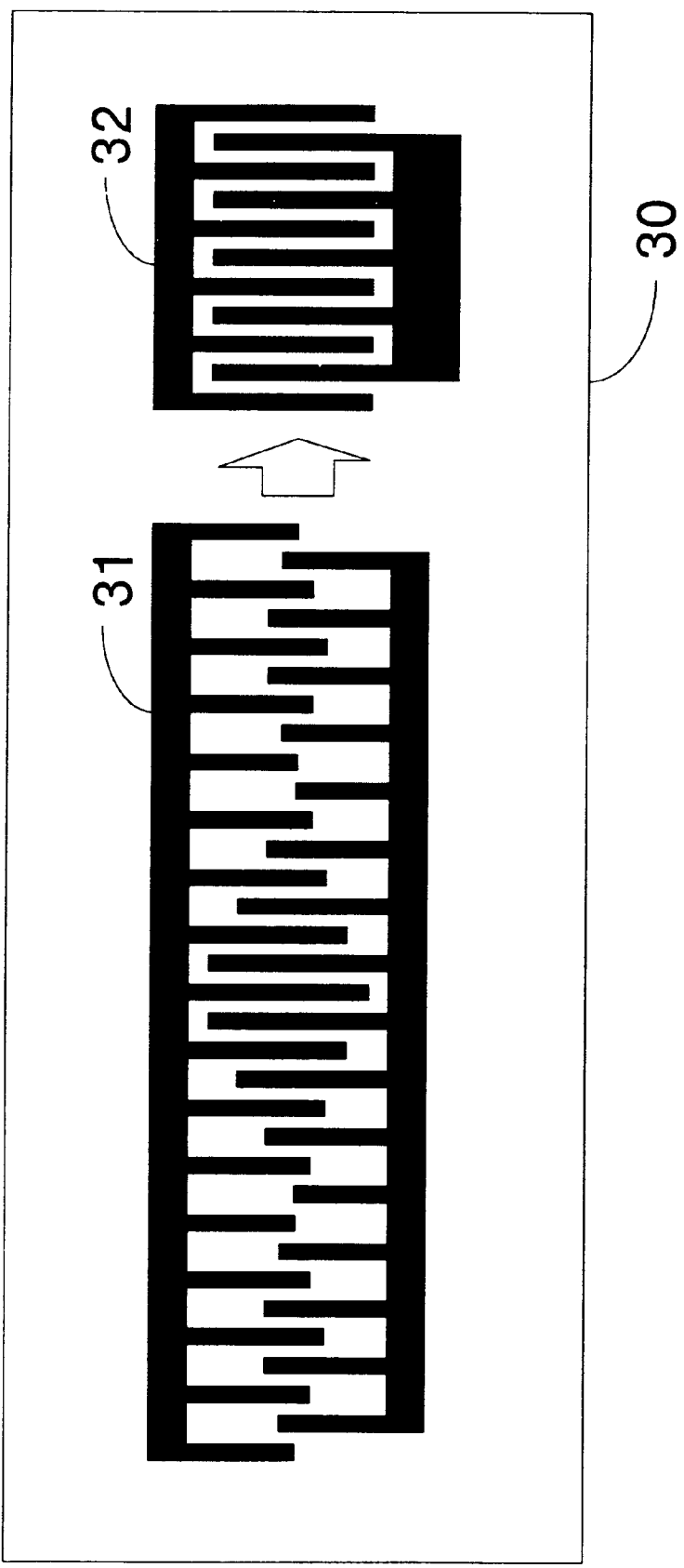
FIG. 18 is a view showing a construction of a conventional surface acoustic wave filter.
Figure 19:
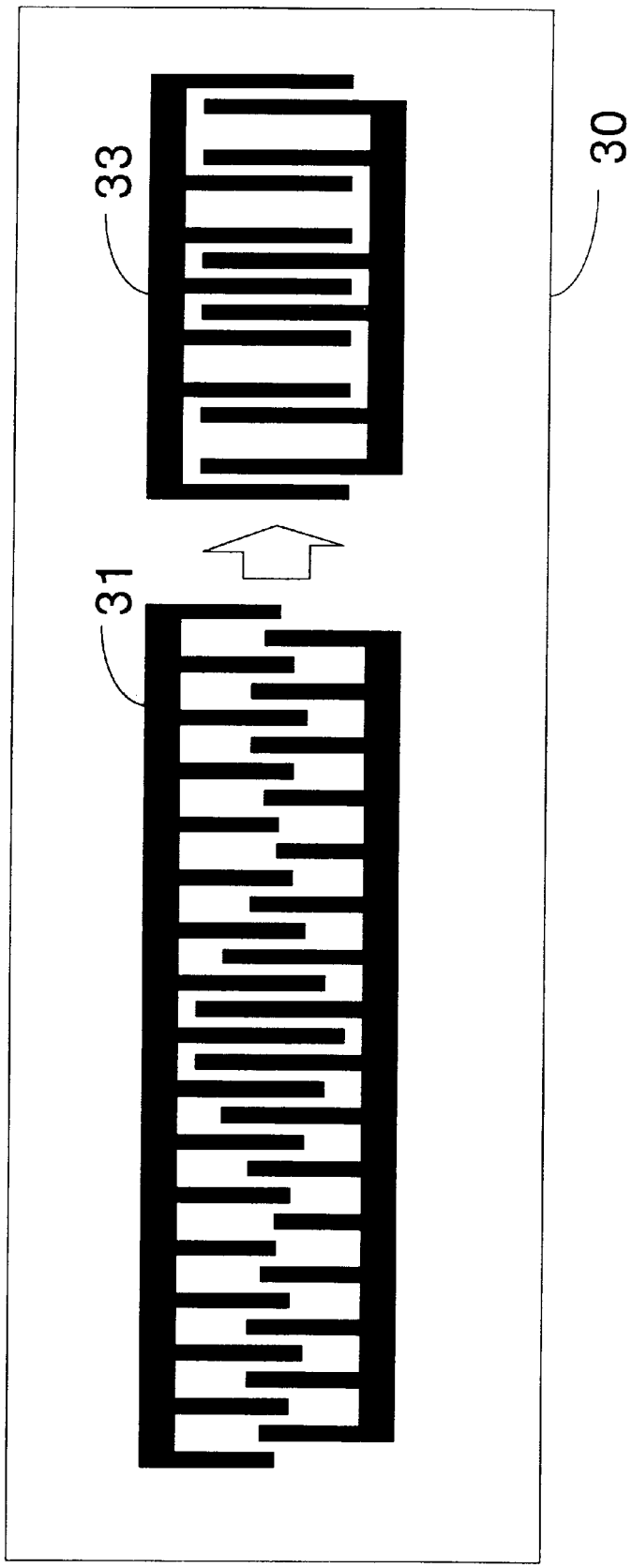
FIG. 19 is a view showing a construction of a conventional surface acoustic wave filter.

As an electrode pattern of the apodized IDT which is the input IDT 1, a left half of an electrode pattern of a conventionally used apodized IDT 31 shown in FIG. 18 is used. An apodized IDT and a withdrawal IDT are two kinds of what are known as weighted interdigital transducers.

Further, direction changing electrodes 3, 4 for changing the propagation direction of the SAW are provided at predetermined distances away from the input IDT and the output IDT in the right and left direction of the paper sheet.

These direction changing electrodes 3, 4 receive the SAW which has been oscillated from the input IDT 1 on the upper stage and propagated in the right direction or in the left direction, and then change the direction of the SAW by 180° so that the SAW will enter the output IDT 2 from the right side or the left side of the output IDT 2 on the lower stage. In FIG. 1, the arrows directed from the input IDT 1 in the right and left directions and the arrows directed from the right and left sides towards the output IDT 2 show propagation directions of the SAWs. However, if the direction changing electrodes 3, 4 are formed of uniform interdigital transducers as shown in FIG. 1, a portion of the SAWs which have been oscillated by the input IDT and propagated in the right and left directions may possibly pass through the direction changing electrodes 3, 4 to reach the end portions of the piezoelectric substrate without being received by the output IDT 2. In other words, among the oscillated SAWs, the remaining SAWs that have changed their directions by 180° by the direction changing electrodes are received by the output IDT 2.

As shown in FIG. 1, each of the direction changing electrodes 3, 4 has a structure in which two uniform interdigital transducers are arranged in the up-and-down direction of the paper sheet and are connected by means of metal film. However, the two interdigital transducers may be connected by a means other than metal film, such as a metal wiring. In other words, the direction changing electrode 3 is composed of an upper interdigital transducer 3a and a lower interdigital transducer 3b; and the direction changing electrode 4 is composed of an upper interdigital transducer 4a and a lower interdigital transducer 4b.

Also, the electrode finger portion of each of the interdigital transducers 3a, 4a is formed approximately in alignment with the electrode finger portion of the input IDT 1 in a horizontal direction. The electrode finger portion of each of the interdigital transducers 3b, 4b is formed approximately in alignment with the electrode finger portion of the output IDT 2 in a horizontal direction.

Here, it is assumed that the horizontal width of each of the direction changing electrodes 3, 4 is Y4; the distance between the interdigital transducer 4a and the input IDT 1 is X1; the distance between the interdigital transducer 4b and the output IDT 2 is X1; the distance between the interdigital transducer 3a and the input IDT 1 is X3; and the distance between the interdigital transducer 3b and the output IDT 2 is X4.

These distances may vary in accordance with the electrode pattern of the apodized IDT 1, the period of the electrode fingers of each electrode, and the material for the piezoelectric substrate. Also, these distances are determined so that the phase of the SAW incident from the left side of the output IDT 2 coincides with the phase of the SAW incident from the right side of the output IDT 2. This is because, since the time at which the SAW propagating in the left direction from the input IDT 1 reaches the output IDT 2 and the time at which the SAW propagating in the right direction from the input IDT 1 reaches the output IDT 2 are different, the two SAWs cancel each other or the required component of the SAWs cannot be obtained if, for example, X1=X3=X4, so that the desired frequency characteristics cannot be obtained.

Here, in FIG. 1, the electrode pattern of the apodized IDT 1 is the left half of the electrode pattern of the apodized IDT 31 of FIG. 18. However, the right half of the electrode pattern 31 of FIG. 18 may equally be used as the electrode pattern of the apodized IDT 1.

Also, the apodized IDT 1 need not include exactly half of the electrode pattern of FIG. 18. Assuming that the electrode pattern of the apodized IDT 31 shown in FIG. 18 includes a weighting means (i.e. the electrodes with varying lengths) exactly required for realizing the desired frequency characteristics as the SAW filter, it is possible to use an electrode pattern including a central portion of the electrode pattern of the apodized IDT 31 of FIG. 18 with the largest oscillation intensity of the SAW and having a width of A% (50≦A≦100) of the width of the electrode pattern of FIG. 18.

In other words, the apodized IDT 1 may be provided at least with an electrode pattern including the central portion of the electrode pattern of FIG. 18 and having 50% of the width of the electrode pattern of the apodized IDT 31 of FIG. 18, whereby the width of the apodized IDT 1 in the oscillation direction of the SAW can be minimized.

Generally, if the apodized IDT 1 is made of an electrode pattern having a width of only A% (50≦A≦100) of the width of the apodized IDT 31 of FIG. 18, the desired frequency characteristics of the SAW filter can be obtained by time-delaying the SAWs propagating towards the output IDT 2 from the right and left sides of the output IDT 2 so that the SAW to be generated by the electrode portion which has not been included in this apodized IDT 1 is contained. The amount of time-delay can be determined by X1, X3, and X4 which are the distances (intervals) between the electrodes, as described before. The electrode pattern is constructed so that a wave having the same intensity distribution as the SAW generated by the apodized IDT 31 of FIG. 18 can be obtained at the output IDT 2 by synthesizing the two SAWs propagating from the right and left sides of the output IDT 2.

By providing this construction, the width of the electrode portion of the SAW filter itself in the oscillation direction of the SAW can be minimized, while maintaining the frequency characteristics of the filter, as compared with the conventional SAW filter shown in FIG. 18. An outline of this principle will be explained hereafter.

Figure 20:
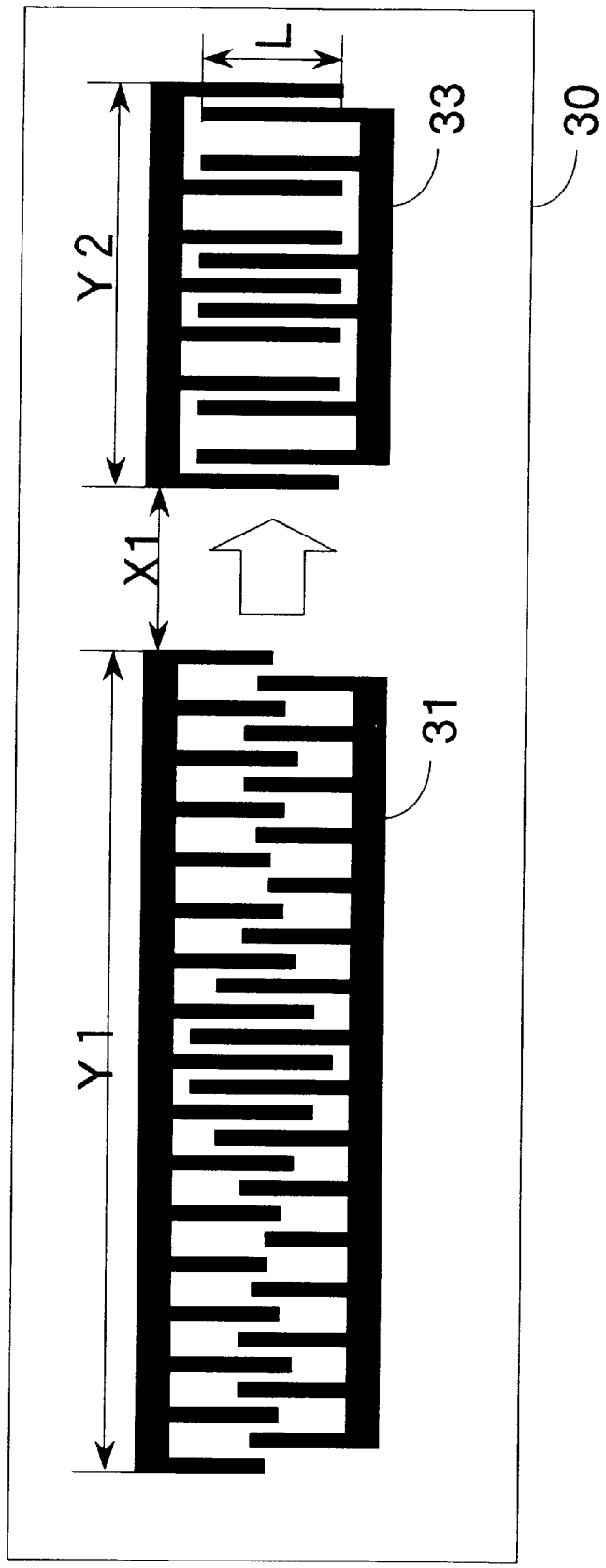
FIG. 20 is a view showing a construction of a conventional surface acoustic wave filter.

First, FIG. 20 shows a construction of a conventional SAW filter. Here, as in FIG. 1, it is assumed that the input IDT is the apodized IDT 31 and the output IDT is the withdrawal IDT 33, with the two electrodes being arranged parallel to and at a predetermined distance X1 away from each other in the oscillation direction of the SAW (the right-and-left direction of the paper sheet).

In this conventional SAW filter, the SAW oscillated by the apodized IDT (the input IDT) 31 and propagating in the left direction from the apodized IDT 31 reaches the left end of the piezoelectric substrate 30 and disappears, whereas the SAW propagating in the right direction from the apodized IDT 31 proceeds straight forward to be detected by the withdrawal IDT (the output IDT) 33.

In the case where the SAW filter of FIG. 20 is to be used as an IF filter, the width of the electrode portion of the SAW filter in the right-and-left direction (i.e. Y1+X1+Y2) will be about 60 mm or more.

Figure 21:
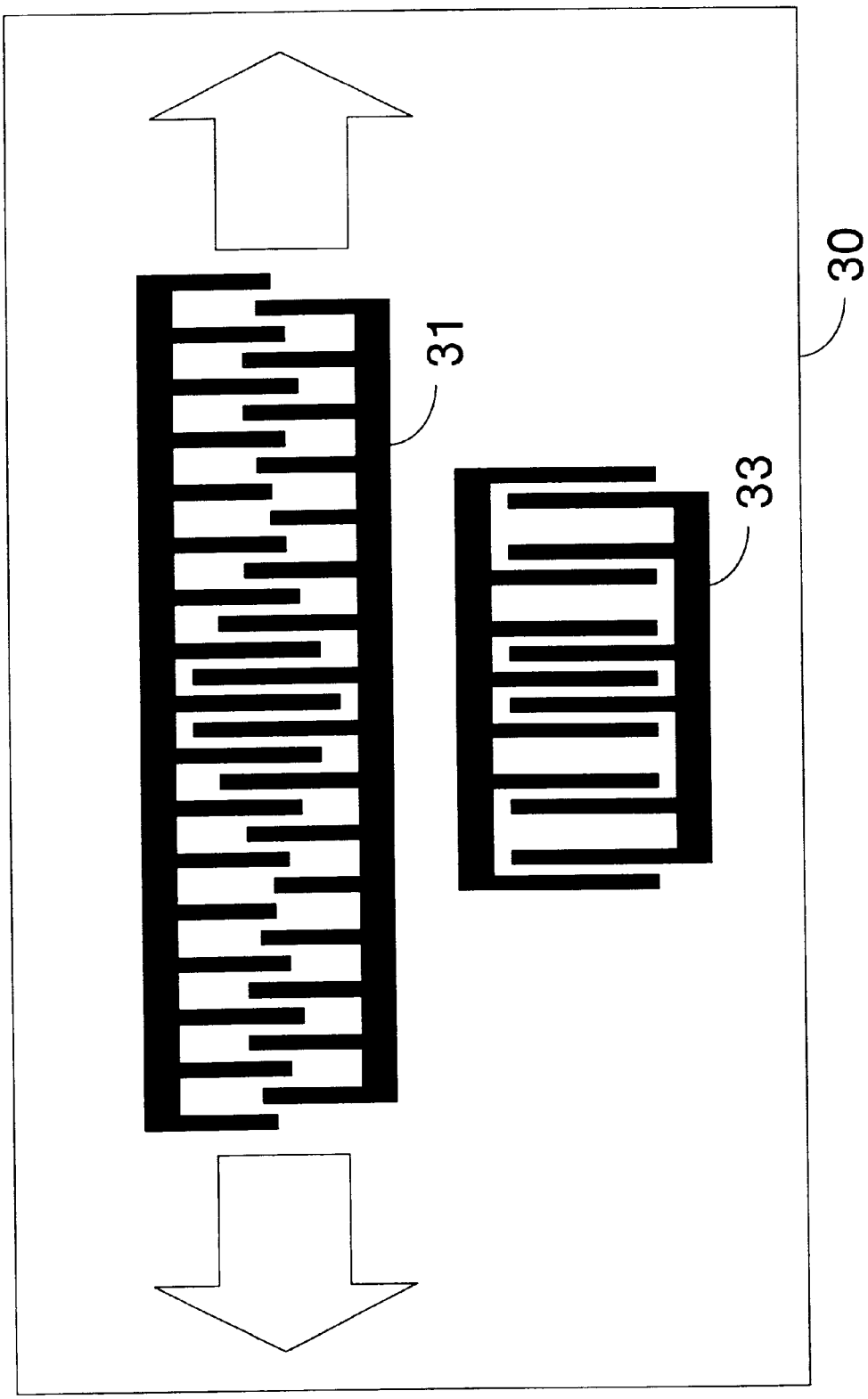
FIG. 21 is a view showing a construction of a surface acoustic wave filter in which an input IDT and an output IDT are arranged in two stages.

FIG. 21 is a view showing a construction of a SAW filter where the apodized IDT 31, which is the input IDT, is disposed on an upper stage and the withdrawal IDT 33, which is the output IDT, is disposed on a lower stage.

By providing this arrangement, the width of the SAW filter in the right-and-left direction can be made smaller than that of the SAW filter of FIG. 20, since the width of the SAW filter is defined by the width Y1 of the longer IDT, i.e. the apodized IDT 31.

However, the SAWs oscillated by the apodized IDT 31 and propagating in the right and left directions from the apodized IDT 31 merely reach the right and left ends of the piezoelectric substrate 30 as they are, and are not received by the withdrawal IDT 33, so that it does not function as a SAW filter by this construction alone.

Figure 22:
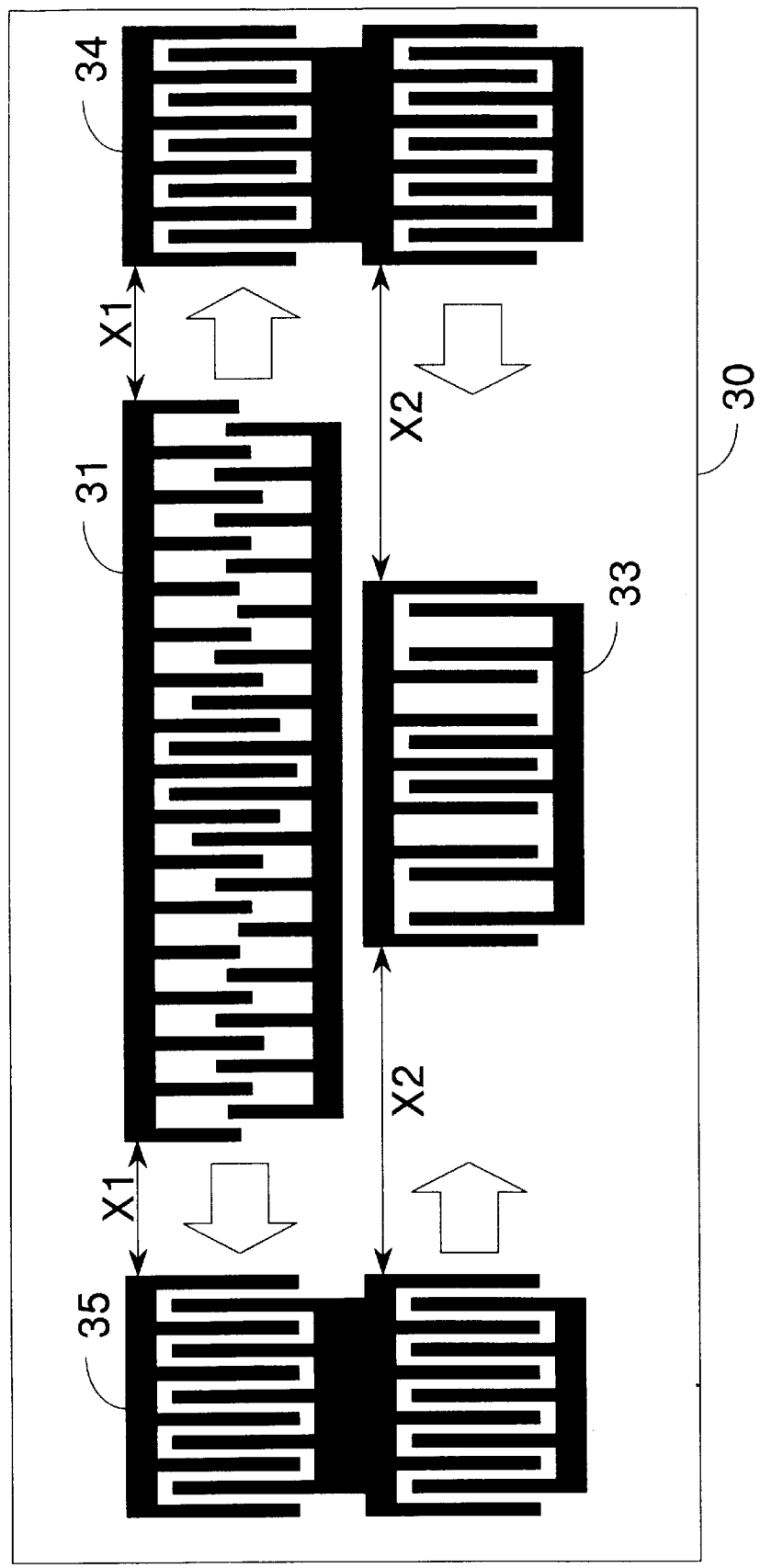
FIG. 22 is a view showing a construction of a surface acoustic wave filter in which a direction changing electrodes is added to the surface acoustic wave filter of FIG. 21 according to one embodiment of the present invention.
Figure 23A:
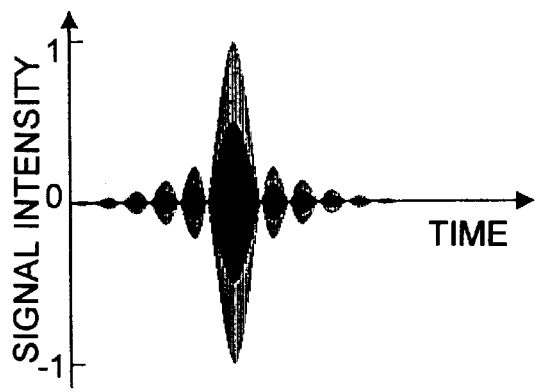
FIGS. 23(a) to 23(d) are explanatory views showing signal intensities of a surface acoustic wave oscillated by the construction of FIG. 22.
Figure 23B:
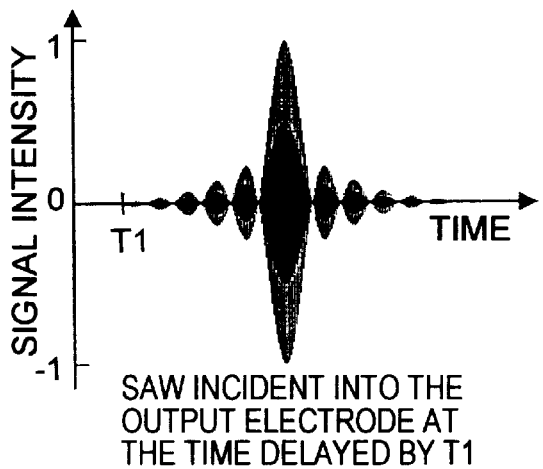
Figure 23C:
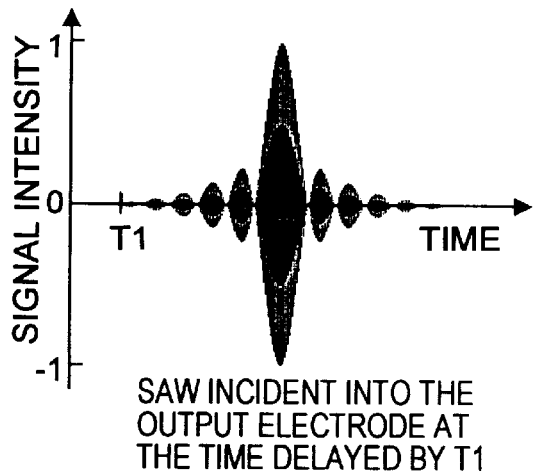
Figure 23D:
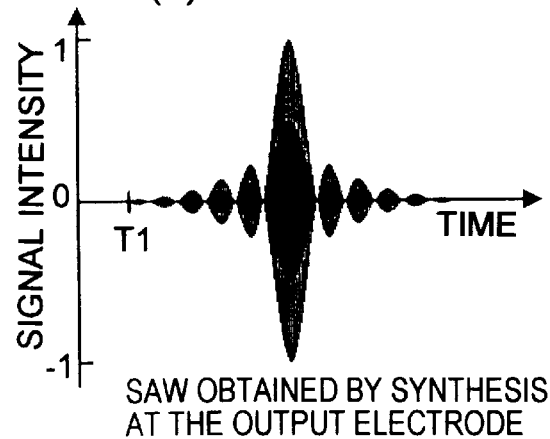

Accordingly, the following SAW filter construction shown in FIG. 22 has been devised. FIG. 22 shows a SAW filter in which direction changing electrodes 34, 35 are disposed on the right and left ends of the piezoelectric substrate 30 in contrast to the construction of FIG. 21. The direction changing electrodes 34, 35 are composed of two interdigital transducers arranged in two (upper and lower) stages.

When the SAWs oscillated by the apodized IDT 31 enter the interdigital transducers of the direction changing electrodes 34, 35 at the upper stage, the SAWs are output from the electrically connected interdigital transducers at the lower stage. Among these output SAWs, those exiting towards the withdrawal IDT 33 are received by the withdrawal IDT 33.

In FIG. 22, each of the apodized IDT 31 and the withdrawal IDT 33 has an electrode pattern which is symmetrical in the right-and-left direction. Therefore, if the distances between the apodized IDT 31 and the two direction changing electrodes 34, 35 are assumed to be the same X1 and that the distances between the withdrawal IDT 33 and the two direction changing electrodes 34, 35 are assumed to be the same X2, the two SAWs incident in the right and left directions into the withdrawal IDT 33, which is the output IDT, have the same phase and the same waveform.

In the case of FIG. 22, since the apodized IDT 31 is the same as that of a conventional SAW filter shown in FIG. 20, the width of the SAW filter in the right-and-left direction is larger than that of FIG. 20 by the width of the disposed direction changing electrodes 34, 35. Accordingly, the construction of FIG. 22 is against the desire for scale reduction though it may meet the desired filter characteristics requirement.

In the meantime, the SAW oscillated by the apodized IDT 31 is a wave that changes its amplitude (signal intensity) in accordance with the passage of time. FIGS. 23(*a*) to 23(*d*) show the change in the signal intensity of the SAW oscillated by the structure shown in FIG. 22.

Here, FIG. 23(*a*) shows an intensity distribution of a SAW immediately after it exits from the input IDT by being oscillated by the apodized IDT 31, which is the input IDT. The SAW is emitted from the input IDT at the time of zero.

FIG. 23(*b*) shows an intensity distribution of a SAW incident into the withdrawal IDT 33 from the right side of the withdrawal IDT 33, which is the output IDT. FIG. 23(*b*) shows that the SAW is incident into the withdrawal IDT 33 at the time delayed by T1.

FIG. 23(*c*) shows an intensity distribution of a SAW incident into the withdrawal IDT 33 from the left side of the withdrawal IDT 33, which is the output IDT. FIG. 23(*c*) shows that the SAW is incident into the withdrawal IDT 33 also at the time delayed by T1.

Since the apodized IDT 31 is symmetrical in the right-and-left direction, the intensity distributions shown in FIGS. 23(*b*) and 23(*c*) are the same.

FIG. 23(*d*) shows that, at the withdrawal IDT 33 which is the output IDT, the signal intensity of the received SAWs is a synthesized intensity obtained by the wave incident from the right side and the wave incident from the left side at the same time. In other words, FIG. 23(*d*) shows an intensity distribution of the SAW taken out from the output IDT.

In FIG. 23(*b*) and others, T1 represents the time at which the first wave oscillated by the input IDT 31 reaches the output IDT 33.

Thus, in the SAW filter having a construction as shown in FIG. 22, the SAW which has changed its direction by the direction changing electrode 35 on the left side and the SAW which has changed its direction by the direction changing electrode 34 on the right side are synthesized at the output IDT 33 to produce a SAW having the frequency distribution shown in FIG. 23(*d*). The desired filter characteristics can be obtained if the signal intensity produced as a result of the synthesis of the SAW incident into the output IDT from the left side and the SAW incident into the output IDT from the right side is as shown in FIG. 23(*d*).

Therefore, it is sufficient that the signal intensity taken out at the output IDT 33 is as shown in FIG. 23(*d*), so that the two SAWs propagating in the right and left directions before impinging into the output IDT need not have signal intensities as shown in FIG. 23(*b*) and 23(*c*).

For example, according to the construction of the SAW filter of the present invention shown in FIG. 1, a SAW having a signal intensity as shown in FIG. 23(*d*) can be received at the output IDT. Since the apodized IDT 1 of FIG. 1 is made of a left half of the apodized IDT of FIG. 22, the intensity distribution of the SAW oscillated by this apodize IDT 1 will be as shown in FIG. 2(*a*). Namely, since the apodized IDT 1 shown in FIG. 1 includes only half of the weighting of the apodized IDT shown in FIG. 22, the oscillated SAW will be a wave with half of the intensity distribution.

FIGS. 2(*a*) to 2(*d*) show signal intensity distributions of a SAW filter of the present invention having the construction shown in FIG. 1. When an oscillated SAW having an intensity distribution as shown in FIG. 2(*a*) is emitted from the right side of the input IDT 1, the SAW enters the output IDT 2 from the right side thereof as a signal having an intensity distribution shown in FIG. 2(*b*). Namely, the SAW enters the output IDT 2 at the time delayed by T1.

On the other hand, the SAW emitted from the left side of the input IDT 1 enters the output IDT 2 from the left side thereof as a signal having an intensity distribution as shown in FIG. 2(*c*). Namely, the SAW enters the output IDT 2 at the time delayed by T2.

Here, if a suitable difference in arrival time is provided between the SAW incident into the output IDT 2 from the right side thereof (FIG. 2(*b*)) and the SAW incident into the output IDT 2 from the left side thereof (FIG. 2(*c*)), the intensity distribution obtained by synthesis of the two SAWs will be as shown in FIG. 2(*d*) similar to that of FIG. 23(*d*), so that a SAW having the desired frequency characteristics of the filter can be obtained at the output IDT 2.

In FIG. 2(*b*), the distances X3, X4 between the electrodes are set so that the SAW incident into the output IDT 2 from the right side thereof arrives at the output IDT 2 between the time T1 and the time T2. Also, in FIG. 2(*c*), the distance X1 between the electrodes is set so that the SAW incident into the output IDT 2 from the left side thereof arrives at the output IDT 2 after the time T2. Here, the time T1 is a time at which the first wave oscillated by the input IDT 1 arrives at the output IDT 2 from the right side of the output IDT 2. The time T2 is a time at which the first wave oscillated by the input IDT 1 arrives at the output IDT 2 from the left side of the output IDT 2.

Thus, by providing a suitable difference in arrival time between the SAWs incident into the output IDT 2 from the right and left sides thereof, the signal intensity distribution obtained by synthesis of the two SAWs at the output IDT 2 will be the same as that shown in FIG. 2(*d*).

In other words, although the width of the apodized IDT 1 is only a half of the width of the conventional apodized IDT 31, a small-size SAW filter having the desired filter characteristics similar to those of a conventional filter can be obtained by adjusting the distances X1, X3, X4 between the electrodes.

In the construction of the SAW filter of the present invention shown in FIG. 1, an interdigital transducer is used as the direction changing electrode. However, the direction changing electrode is not limited to the interdigital transducer alone. Namely, it is sufficient that the direction changing electrode has a construction such that the SAWs emitted in the right and left directions from the input IDT on the upper stage change their directions to propagate towards the output IDT on the lower stage.

FIGS. 3 and 4 show constructions of other embodiments of the SAW filters according to the present invention. FIG. 3 shows a SAW filter provided with reflectors (5a, 5b, 5c, 5d) having electrode fingers arranged in an oblique direction for rotating the propagation direction of the SAW by 90° instead of the direction changing electrodes 3, 4 of FIG. 1.

The inclination of the electrode fingers in the reflectors is determined by the type of the piezoelectric substrate and the velocity of the propagating SAW.

Figure 5:
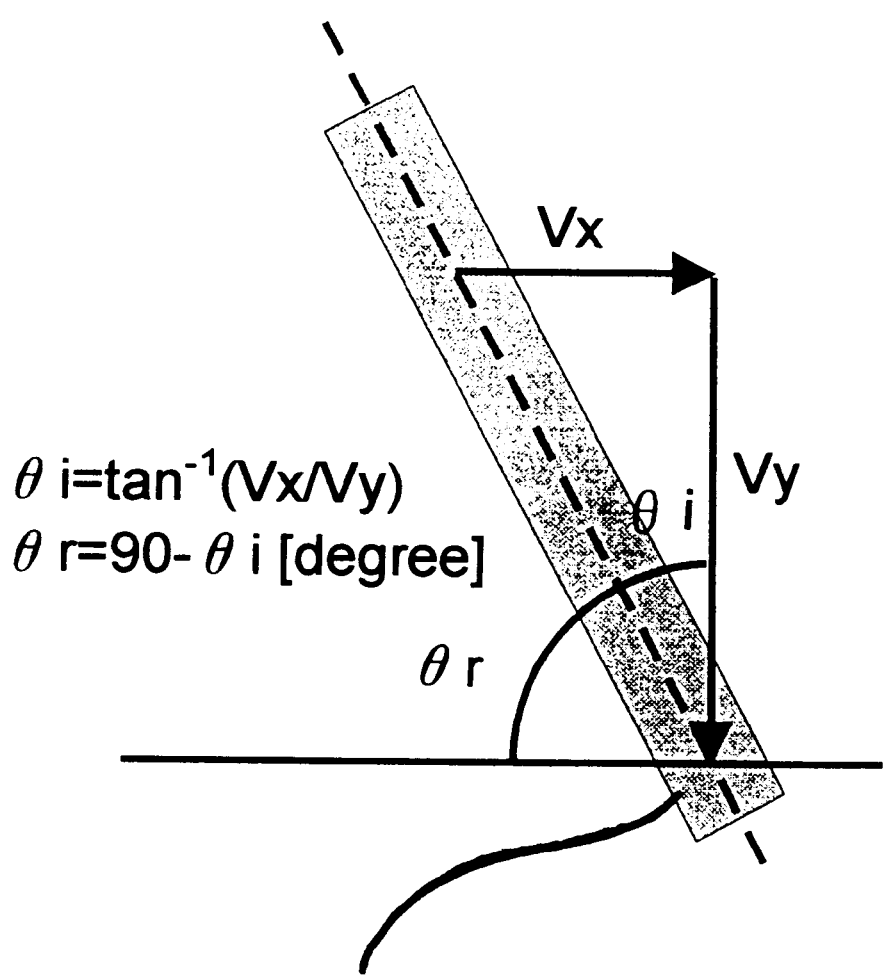
FIG. 5 is an explanatory view showing a relationship between an inclination of a reflector and a velocity of a surface acoustic wave according to the present invention.

FIG. 5 is an explanatory view showing a relationship between the inclination θr of the electrode finger 6 in the reflectors and the velocity (Vx, Vy) of the SAW.

Assuming that the velocity of the SAWs oscillated by the input IDT and propagating in the right and left directions of the paper sheet is Vx and the velocity of the SAWs rotated by 90° by the reflectors and propagating in the up and down directions of the paper sheet is Vy, the inclination θr can be determined by the following formula:

$$\theta r = 90° - \theta i = 90° - \tan^{-1}(Vx/Vy)$$

Figure 2A:
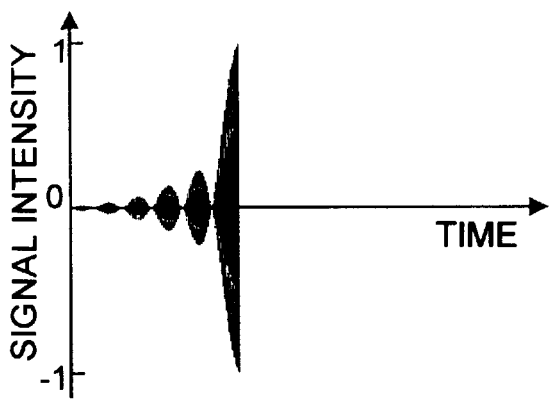
FIGS. 2(a) to 2(d) are explanatory views showing signal intensity distributions of the surface acoustic wave filter according to the present invention.
Figure 2B:
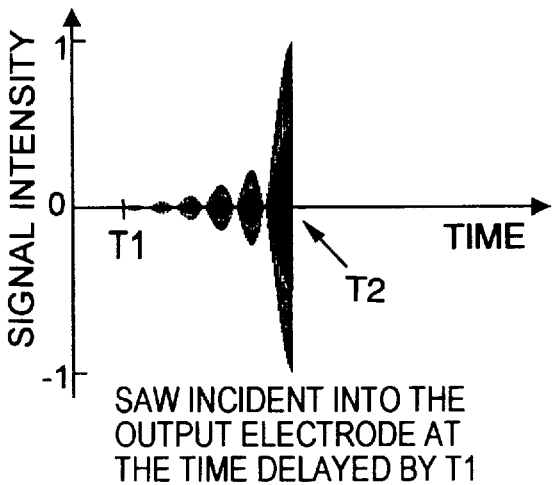
Figure 2C:
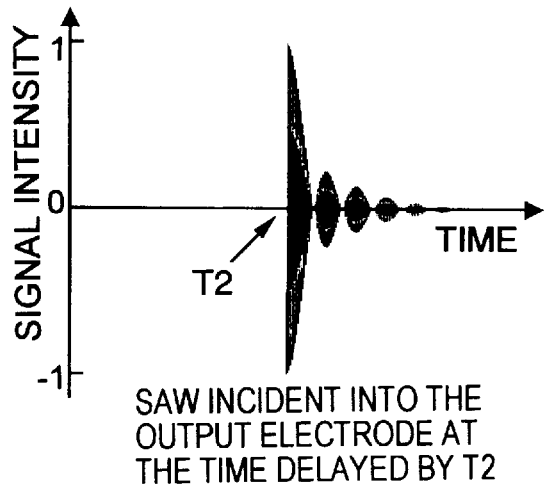
Figure 2D:
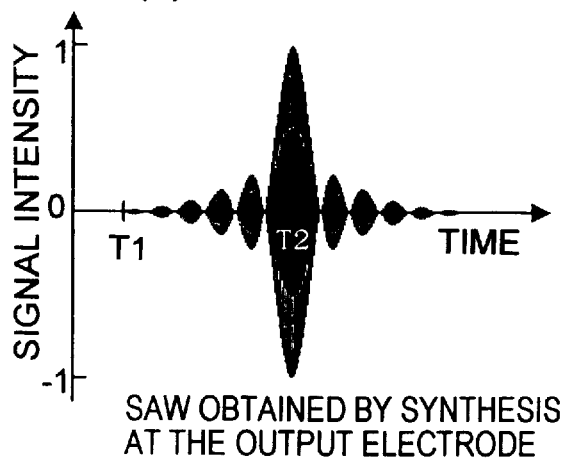

In the construction shown in FIG. 3, a synthesized SAW having the signal intensity shown in FIG. 2(d) can be obtained at the output IDT 2 if the apodized IDT 1 which is the input IDT has at least a half of the width of the apodized IDT 31 shown in FIG. 22, in a similar manner as that of FIG. 1.

FIG. 4 shows a SAW filter further provided with electrodes having a grating structure (7a, 7b: hereafter referred to as grating electrodes) in the propagation passageway of the SAWs in addition to the construction of FIG. 3.

Here, by providing the grating electrodes, the adverse effects caused by diffraction of the SAWs can be reduced as compared with the case in which a free surface is provided as shown in FIG. 3, because the degree of freedom in the propagation of the SAWs is limited by the grating structure.

Also, in order to prevent the SAWs from being reflected by the grating electrodes, the interval between the electrode fingers in the grating structure is preferably about $1/1.3$ or less of the period of the SAWs oscillated by the input IDT 1.

For manufacturing the SAW filters of FIGS. 1, 3, and 4 as explained above, the same process as the manufacturing process of the conventional SAW filters shown in FIG. 18 and the like can be utilized except that the electrode patterns to be formed are different. There is no need to add a complicated process.

Embodiments

Hereafter, an embodiment will be shown in which the SAW filter of the present invention is used as an IF filter with a center frequency of 70 MHz. However, it is to be noted that the present invention is not limited to the following embodiments alone.

A piezoelectric substrate 10 on which an input IDT 1, an output IDT 2, and the like are to be formed is made of a quartz substrate of 42° 45' rotation Y, X propagation which is generally called an ST-cut quartz. It is assumed that the propagation direction of the SAW oscillated by the input IDT is the X direction. The input IDT, the output IDT, the direction changing electrodes, and the like are formed of aluminum having a thickness of 300 nm. However, the material for the piezoelectric substrate 10, the cutting direction, the thickness of the electrodes, and the material for the electrodes are not limited to those shown above, and it is sufficient to select the most suitable ones according to the required filter characteristics.

At this time, the velocity of the SAW oscillated on the piezoelectric substrate 10 is 3147.2 m/s. Also, if the center frequency $f_0$ is 70 MHz, the period λ of the interdigital transducer will be λ=44.96 μm, since the period λ of the interdigital transducer and the velocity V of the SAW satisfy the relationship: $V = f_0 \times \lambda$.

Figure 24:
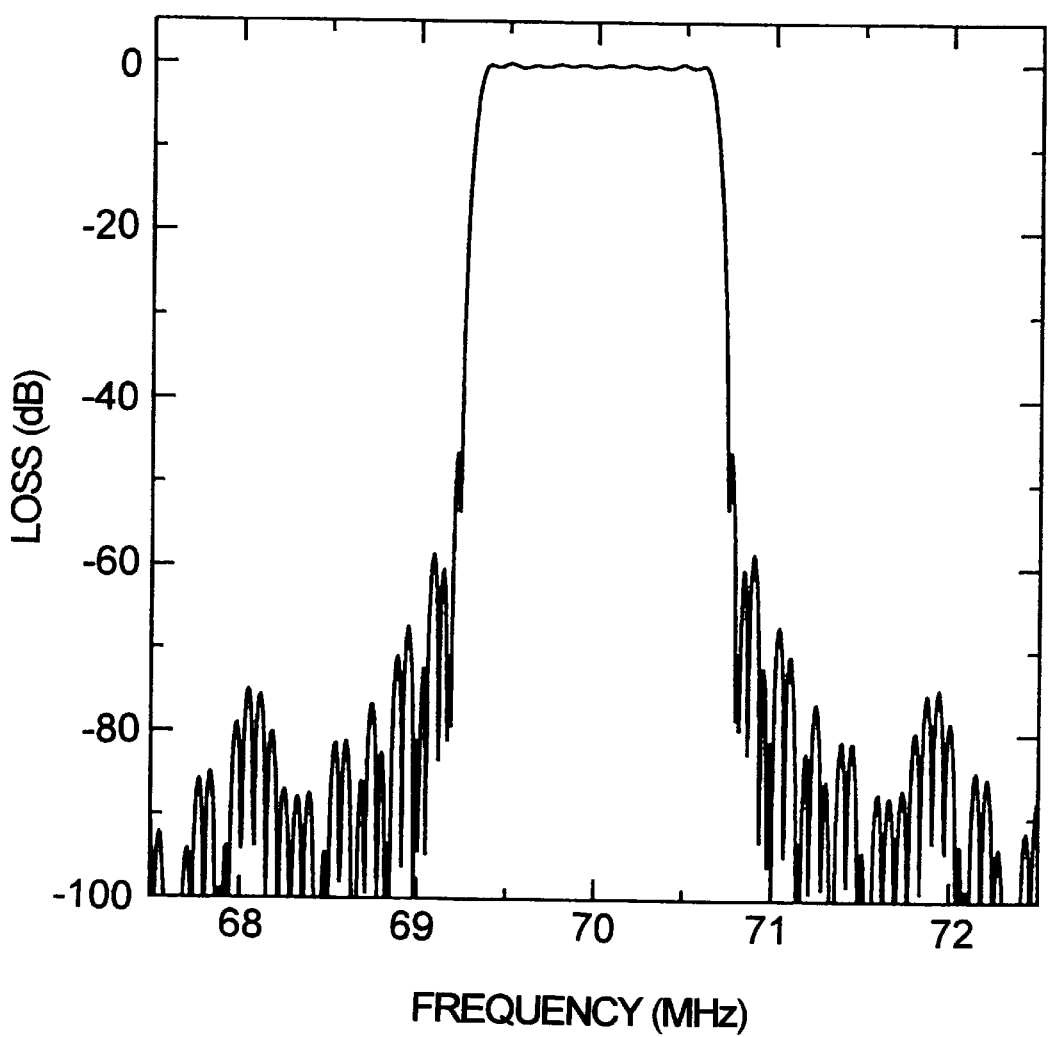
FIG. 24 is a graph showing frequency characteristics of a conventional surface acoustic wave filter.

In the conventional example shown in FIG. 20, the number of electrode pairs in the apodized IDT 31, which is the input IDT, is 1000; while the number of electrode pairs in the withdrawal IDT 33, which is the output IDT, is 363. The aperture length L is 80. From the period of the electrodes λ=44.96 μm, it is found that the width Y1 of the input IDT 31 in the oscillation direction is at least Y1=44960 μm, and the width Y2 of the output IDT 33 in the oscillation direction is at least Y2=16320.48 μm. If it is assumed that the interval between the input and output IDTs is X1=1000 μm, the total length of the electrodes in the right-and-left direction is Y1+Y2+X1=62280.48 μm. FIG. 24 shows the frequency characteristics of the SAW filter of this conventional example.

On the other hand, in the construction of the present invention shown in FIG. 1, the number of electrode pairs in the apodized IDT 1, which is the input IDT, can be reduced to 500. Also, it is assumed that the number of electrode pairs in the withdrawal IDT 2, which is the output IDT, is 363, and the number of electrode pairs in the direction changing electrodes 3, 4 is 20. At this time, the width of the input IDT in the oscillation direction is Y3=Y1/2=22480 μm, X1=1 mm, the width of the output IDT in the oscillation direction is Y2=16320.48 μm, and the width of the direction changing IDTs in the oscillation direction is Y4=899.2 μm. The free surface area (X3+X4) for providing time adjustment of the SAW propagating in the right direction is determined by the sum of T1 (=the period of time required for the SAW to propagate for a distance of 2×X1) and T2 (=the period of time required for the SAW to propagate for a distance of Y3 of the input IDT) in FIG. 2.

Accordingly, X3+X4=(2×X1)+Y3=24480 μm. Here, it is when X4−X3=Y3−Y2 that the length of the SAW filter in the right-and-left direction attains its minimum. From these equations, it is sufficient that X3=9160.24 μm, and X4=15319.76 μm. At this time, the total length of the electrodes in the SAW filter shown in FIG. 1 will be Y4+X1+Y3+X3+Y4=35438.64 μm.

Figure 6:
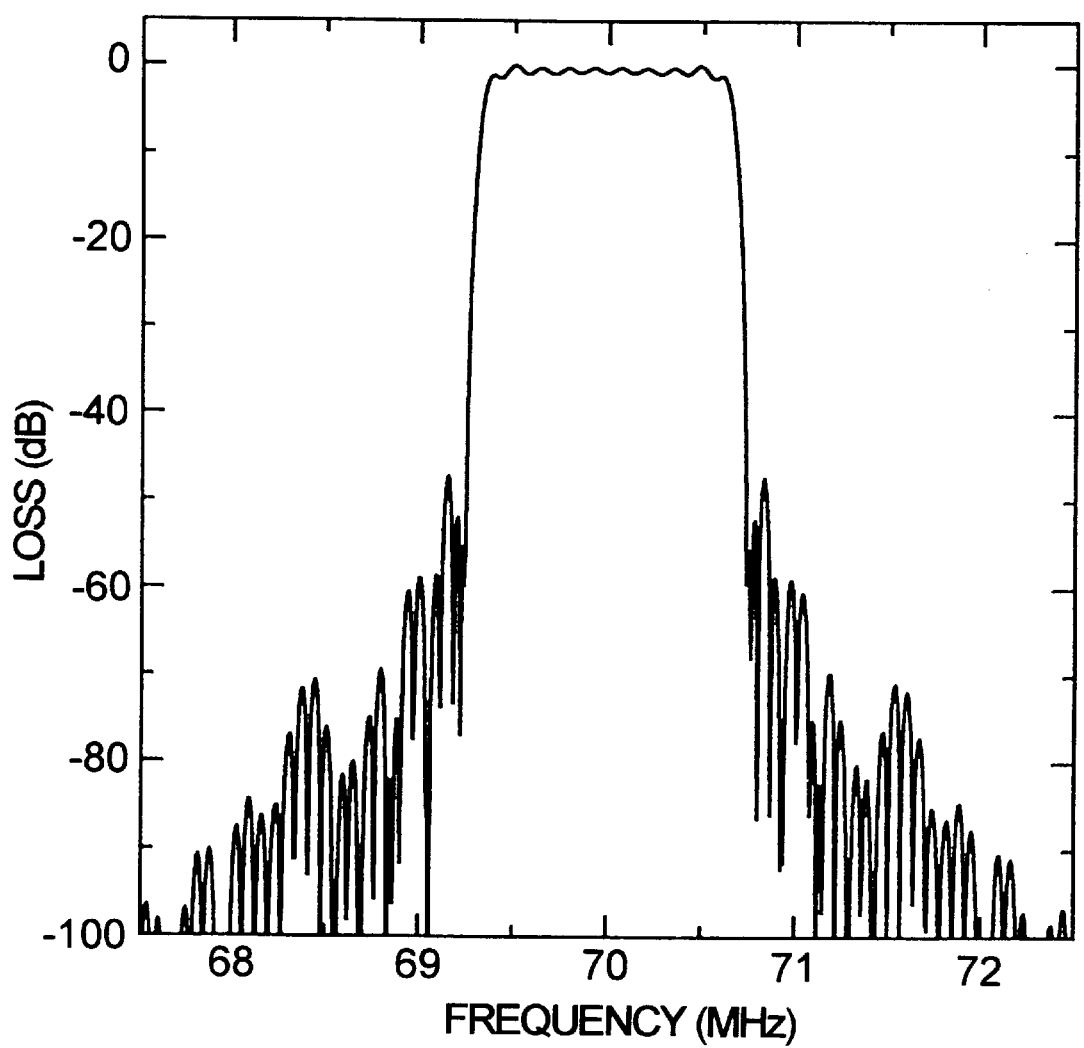
FIG. 6 is a graph showing frequency characteristics of the surface acoustic wave filter of FIG. 1.

Consequently, in contrast with the width=62280.48 μm of the electrodes of the conventional filter shown in FIG. 22 in the right-and-left direction, the width of the filter of the present invention shown in FIG. 1 can be smaller by about 26000 μm. Generally, the size in the aperture length direction is small and it will not be a great problem. FIG. 6 shows frequency characteristics of the SAW filter shown in FIG. 1. When FIG. 6 and FIG. 24 are compared, it is understood that approximately the same characteristics can be obtained.

Next, since the reflectors are used in the construction shown in FIG. 3, the characteristics of the reflectors must be considered. Accordingly, the thickness of the electrodes is assumed to be 2.1 μm. With this thickness, the velocity of the SAWs in the oscillation direction of the ST-cut quartz substrate is 3068 m/s. With the center frequency of 70 MHz, the period of the electrodes is about 43.83 μm.

Also, it is assumed that the number of electrode pairs in the apodized IDT 1 which is the input IDT is 500, the number of electrode pairs in the reflector 5a or the like is 50, and the number of electrode pairs in the withdrawal IDT 2 which is the output IDT is 367. Further, for adjustment of the propagation time of the SAWs, electrodes 7a, 7b having a grating structure with a period of ⅓ of the period of the input and output IDTs may be formed, as shown in FIG. 4.

If the grating electrodes 7a, 7b are formed, the velocity of the SAWs propagating in the up-and-down direction of the paper sheet is 4646 m/s in the case of an ST-cut quartz substrate. In this case, since the velocity of the SAWs propagating in the oscillation direction is Vx=3068 m/s and the velocity in the up-and-down direction is Vy=4646 m/s, it is found that $\theta r=56.56°$ from the equation $\theta r=90°-\tan^{-1}(Vx/Vy)$.

Assuming that the number of electrode fingers in the reflectors corresponds to 50 periods required in the case where the electrode fingers are parallel to the up-and-down direction of the paper sheet, the length Y5 of the reflector is Y5=50×43.83 µm=2191.5 µm. Also, the width of the input IDT in the right-and-left direction is Y3=Y1/2=21915 µm; X1=1000 µm; and the width of the output IDT in the right-and-left direction is Y2=15910.29 µm.

The free surface area (X3+X4) for providing time adjustment of the SAW exiting from the input IDT in the right direction is determined by the sum of T1 (=the period of time required for the SAW to propagate for a distance of 2×X1) and T2 (=the period of time required for the SAW to propagate for a distance of Y3 of the input IDT) in FIG. 2.

Namely, X3+X4=(2×X1+Y3)=23915 µm. Here, in order to minimize the width of the electrodes in the right-and-left direction, it is sufficient that the relationship X4−X3=Y3−Y2 holds. From these equations, it is sufficient that X3=8955.145 µm, and X4=14959.855 µm. At this time, the total width of the electrodes of the SAW filter in the right-and-left direction in FIG. 3 of the present invention will be Y5+X1+Y3+X3+Y5=36253.145 µm.

Figure 7:
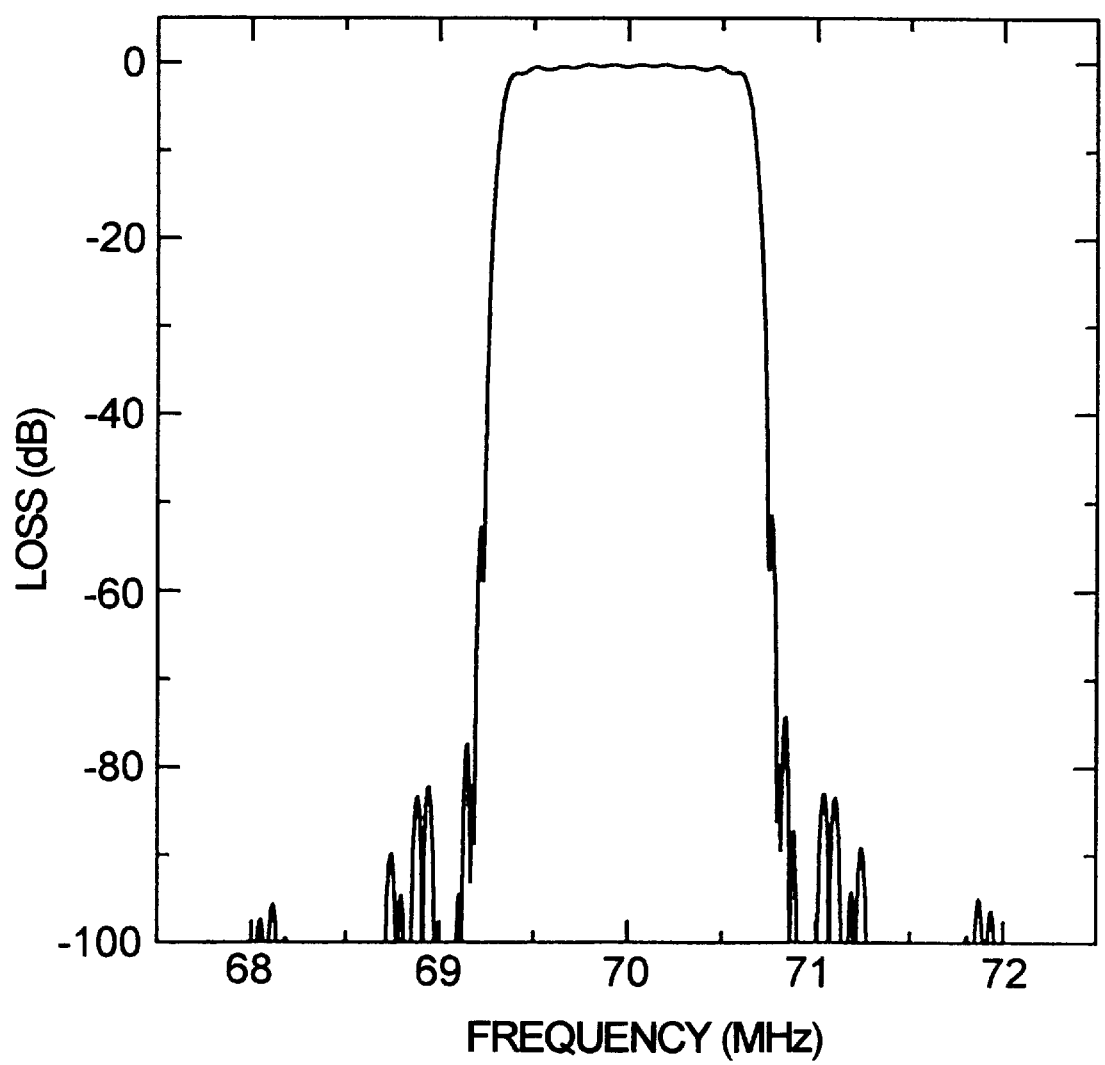
FIG. 7 is a graph showing frequency characteristics of the surface acoustic wave filter of FIG. 3.

Consequently, in contrast with the conventional construction shown in FIG. 22, the width of the filter in the right-and-left direction according to this embodiment of the present invention shown in FIG. 3 can be smaller by about 24000 µm. The size in the aperture length direction is small and it will not be a great problem in this case as well. FIG. 7 shows frequency characteristics of the SAW filter shown in FIG. 3.

Next, an explanation will be given on other embodiments of SAW filters according to the present invention in which the construction of the input and output IDTs is different.

Figure 8:
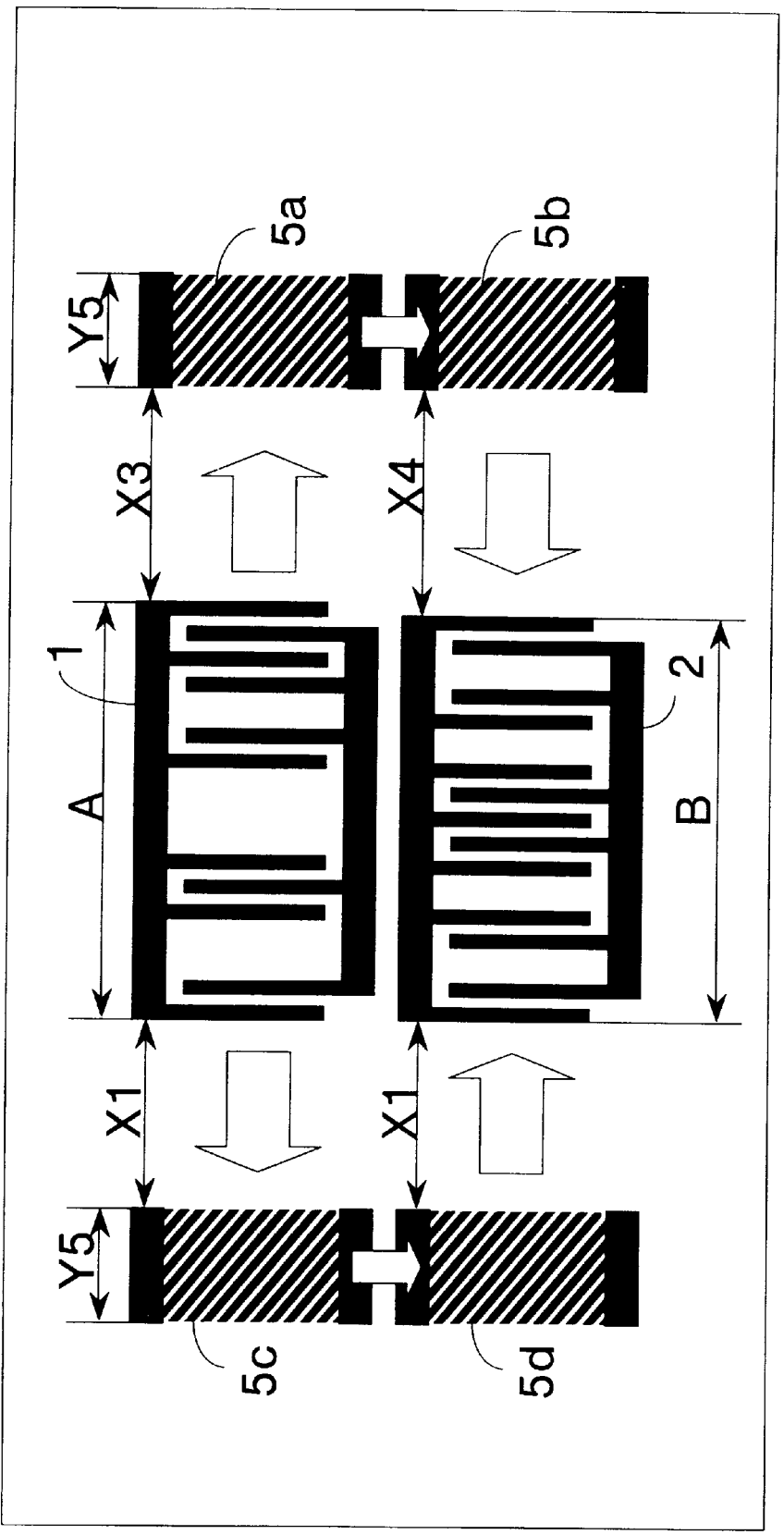
FIG. 8 is a view showing a construction of a surface acoustic wave filter according to one embodiment of the present invention in which withdrawal IDTs are used as an input IDT and as an output IDT.

FIG. 8 shows a construction of an embodiment of a SAW filter according to the present invention in which withdrawal IDTs are used as the input IDT and the output IDT.

In FIG. 8, the output IDT 2 is an ordinary withdrawal IDT which is conventionally used, whereas the input IDT 1 is a withdrawal IDT in which the number of electrode finger pairs is reduced.

The input IDT 1 has a width of A=18824.985 µm in the right-and-left direction. However, the number of electrode finger pairs is reduced to about half (430 pairs) of the number of electrode finger pairs in an ordinary input IDT. The output IDT 2 is formed so that the output IDT 2 has a width B=15734.97 µm in the right-and-left direction and the number of electrode finger pairs is 359. Also, in FIG. 8, it is assumed that Y5=43.83×50 pairs=2191.5 µm, and X1=1000 µm.

In this embodiment, if the filter is designed to satisfy the conditions A+2×X1=X3+X4 and X4−X3=A−B, the omitted portion of the SAWs oscillated by the input IDT can be reproduced by a synthesized wave form obtained at the output IDT, and further the width of the SAW filter in the right-and-left direction can be minimized. From the above two equations, it is found that X3=8867.485 µm and X4=10957.5 µm.

At this time, the width of the electrodes in the right-and-left direction in the SAW filter is Y5+X1+A+X3+Y5=33075.47 µm. In a conventional SAW filter such as shown in FIG. 22, the width of the electrodes in the right-and-left direction is 2×A+X1+B=54384.94 µm.

Therefore, according to the construction of the present invention shown in FIG. 8, the size of the SAW filter can be reduced by 21309.47 µm as compared with the conventional filter.

Figure 9:
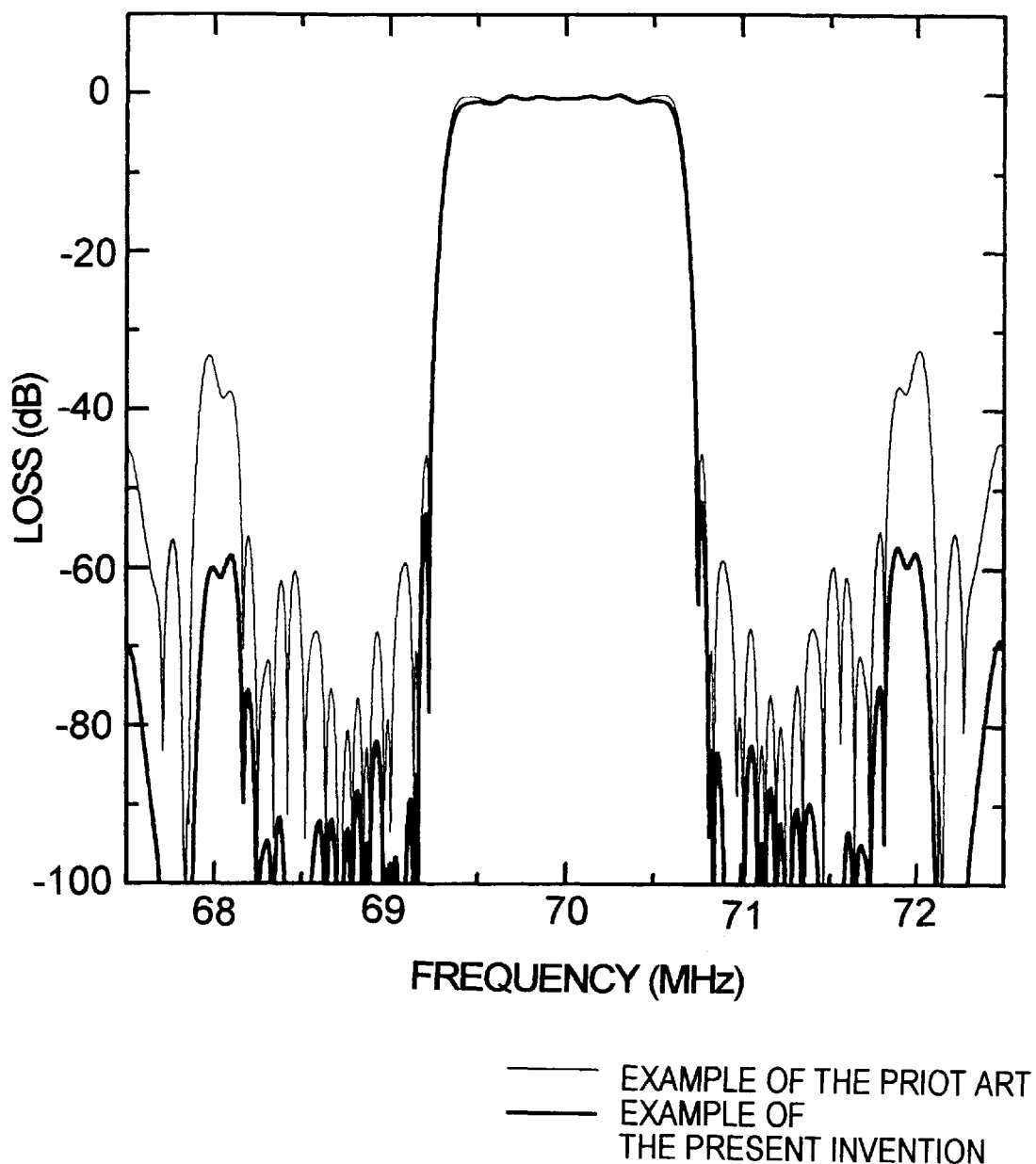
FIG. 9 is a graph showing frequency characteristics of the surface acoustic wave filter of FIG. 8.

FIG. 9 is a graph showing frequency characteristics of the SAW filter of FIG. 8. In FIG. 9, a thin line shows a graph of a conventional construction, whereas a thick line shows a graph of the construction of FIG. 8 of the present invention. It is found that, in the construction of FIG. 8, the loss outside the passband has increased, showing an improvement.

Figure 10:
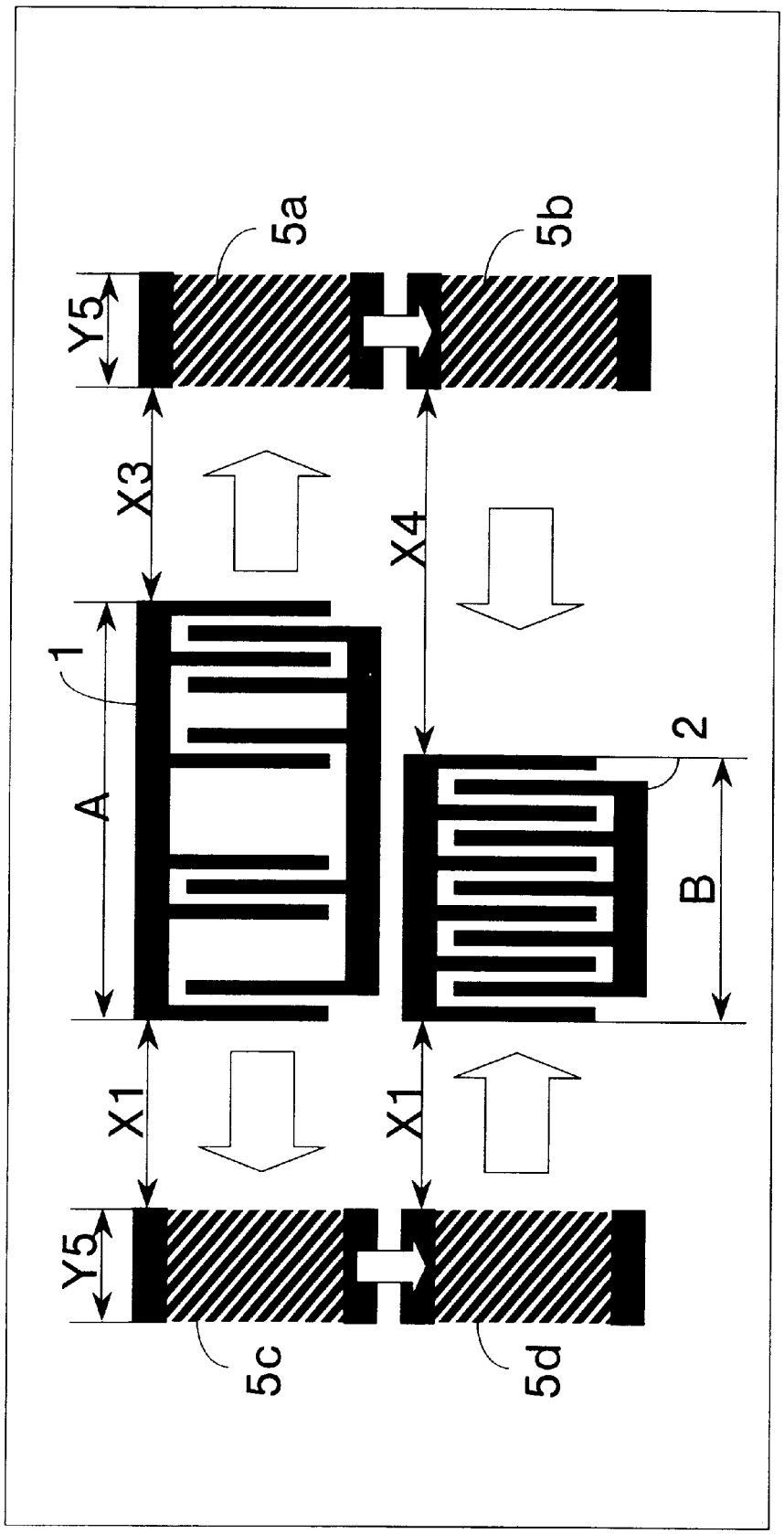
FIG. 10 is a view showing a construction of a surface acoustic wave filter according to one embodiment of the present invention in which a withdrawal IDT is used as an input IDT and a uniform IDT is used an output IDT.

FIG. 10 shows a construction of an embodiment of a SAW filter of the present invention in which a withdrawal IDT is used as the input IDT and a uniform IDT is used as the output IDT.

In FIG. 10, the input IDT 1 is a withdrawal IDT in which the number of electrode finger pairs is reduced. The input IDT 1 has a width of A=17729.235 µm in the right-and-left direction and the number of electrode finger pairs is reduced to about half (405 pairs) of the number of electrode finger pairs in an ordinary input IDT. The output IDT 2 is formed so that the output IDT 2 has a width B=2191.5 µm in the right-and-left direction and the number of electrode finger pairs is 50. Also, it is assumed that Y5=43.83×50 pairs= 2191.5 µm, and X1=1000 µm.

In this embodiment, if the filter is designed to satisfy the conditions A+2×X1=X3+X4 and X4−X3=A−B, the omitted portion of the SAWs oscillated by the input IDT can be reproduced by a synthesized wave form obtained at the output IDT, and further the width of the SAW filter in the right-and-left direction can be minimized. From the above two equations, it is found that X3=2095.75 µm and X4=17633.485 µm.

At this time, the width of the electrodes in the right-and-left direction in the SAW filter is Y5+X1+A+X3+Y5=25207.985 µm. In a conventional SAW filter such as shown in FIG. 22, the width of the electrodes in the right-and-left direction is 2×A+X1+B=38649.75 µm.

Therefore, according to the construction of the present invention shown in FIG. 10, the size of the SAW filter can be reduced by 13441.765 µm as compared with the conventional filter.

Figure 11:
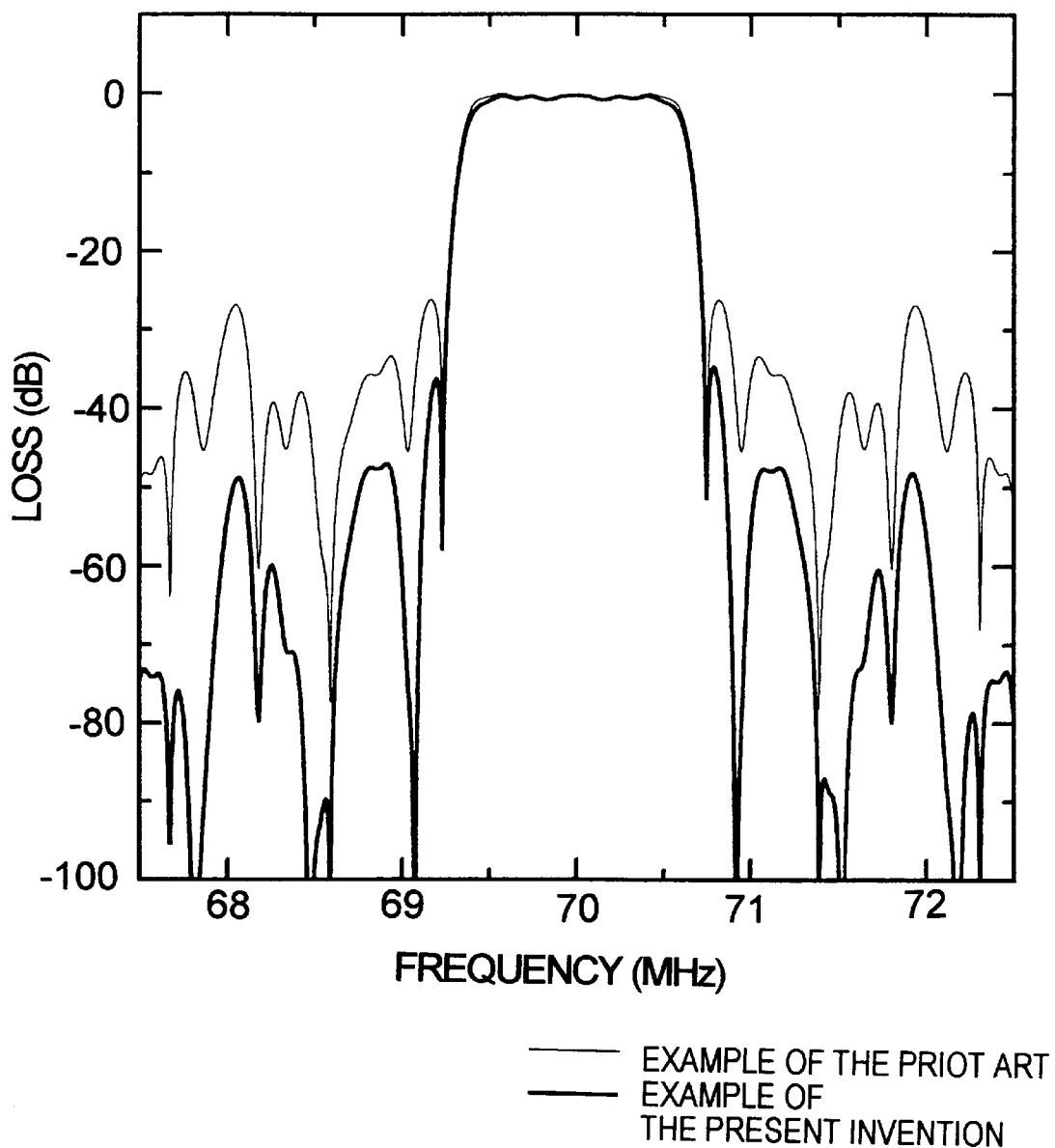
FIG. 11 is a graph showing frequency characteristics of the surface acoustic wave filter of FIG. 10.

FIG. 11 is a graph showing frequency characteristics of the SAW filter of FIG. 10. In FIG. 11, a thin line shows a graph of a conventional construction, whereas a thick line shows a graph of the construction of FIG. 10 of the present invention. It is found that, in the construction of FIG. 10, the loss outside the passband has increased, showing an improvement.

Figure 12:
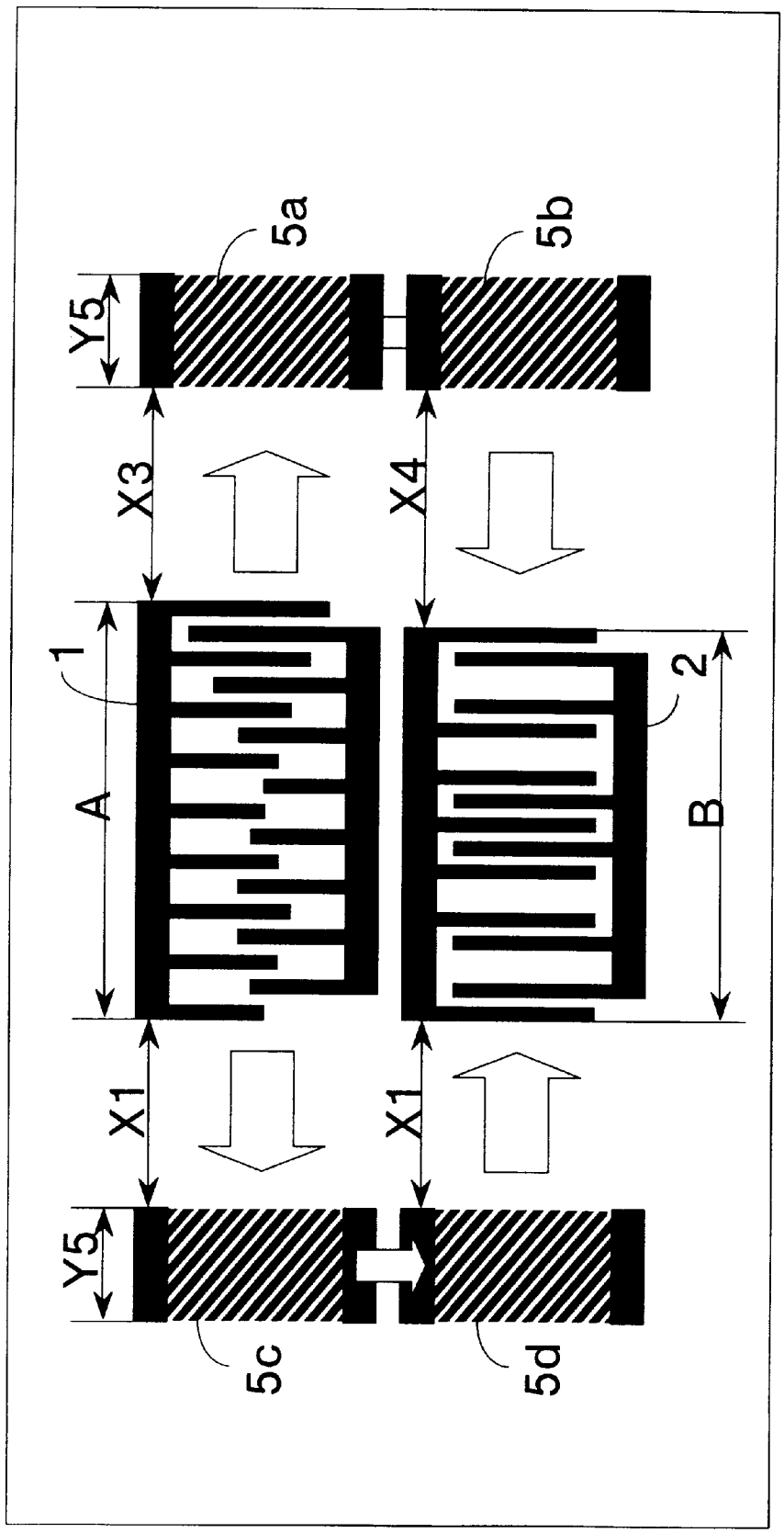
FIG. 12 is a view showing a construction of a surface acoustic wave filter according to one embodiment of the present invention in which an apodized IDT is used as an input IDT and a withdrawal IDT is used an output IDT.

FIG. 12 shows a construction of an embodiment of a SAW filter of the present invention in which an apodized IDT is used as the input IDT and a withdrawal IDT is used as the output IDT.

In FIG. 12, the output IDT 2 is a normal withdrawal IDT which is conventionally used, whereas the input IDT 1 is an apodized IDT in which the number of electrode finger pairs is reduced. The input IDT 1 has a width of A=21915 µm in the right-and-left direction and the number of electrode finger pairs is reduced to about half (500 pairs) of the number of electrode finger pairs in an ordinary input IDT. The output IDT 2 is formed so that the output IDT 2 has a width B=15910.29 μm in the right-and-left direction and the number of electrode finger pairs is 363. Also, it is assumed that Y5=43.83×50 pairs=2191.5 μm, and X1=1000 μm.

In this embodiment, if the filter is designed to satisfy the conditions A+2×X1=X3+X4 and X4−X3=A−B, the omitted portion of the SAWs oscillated by the input IDT can be reproduced by a synthesized wave form obtained at the output IDT, and further the width of the SAW filter in the right-and-left direction can be minimized. From the above two equations, it is found that X3=8955.145 μm and X4=14959.855 μm.

At this time, the width of the electrodes in the right-and-left direction in the SAW filter is Y5+X1+A+X3+Y5= 36253.145 μm. In a conventional SAW filter such as shown in FIG. 22, the width of the electrodes in the right-and-left direction is 2×A+X1+B=60740.29 μm.

Therefore, according to the construction of the present invention shown in FIG. 12, the size of the SAW filter can be reduced by 24487.145 μm as compared with the conventional filter.

Figure 13:
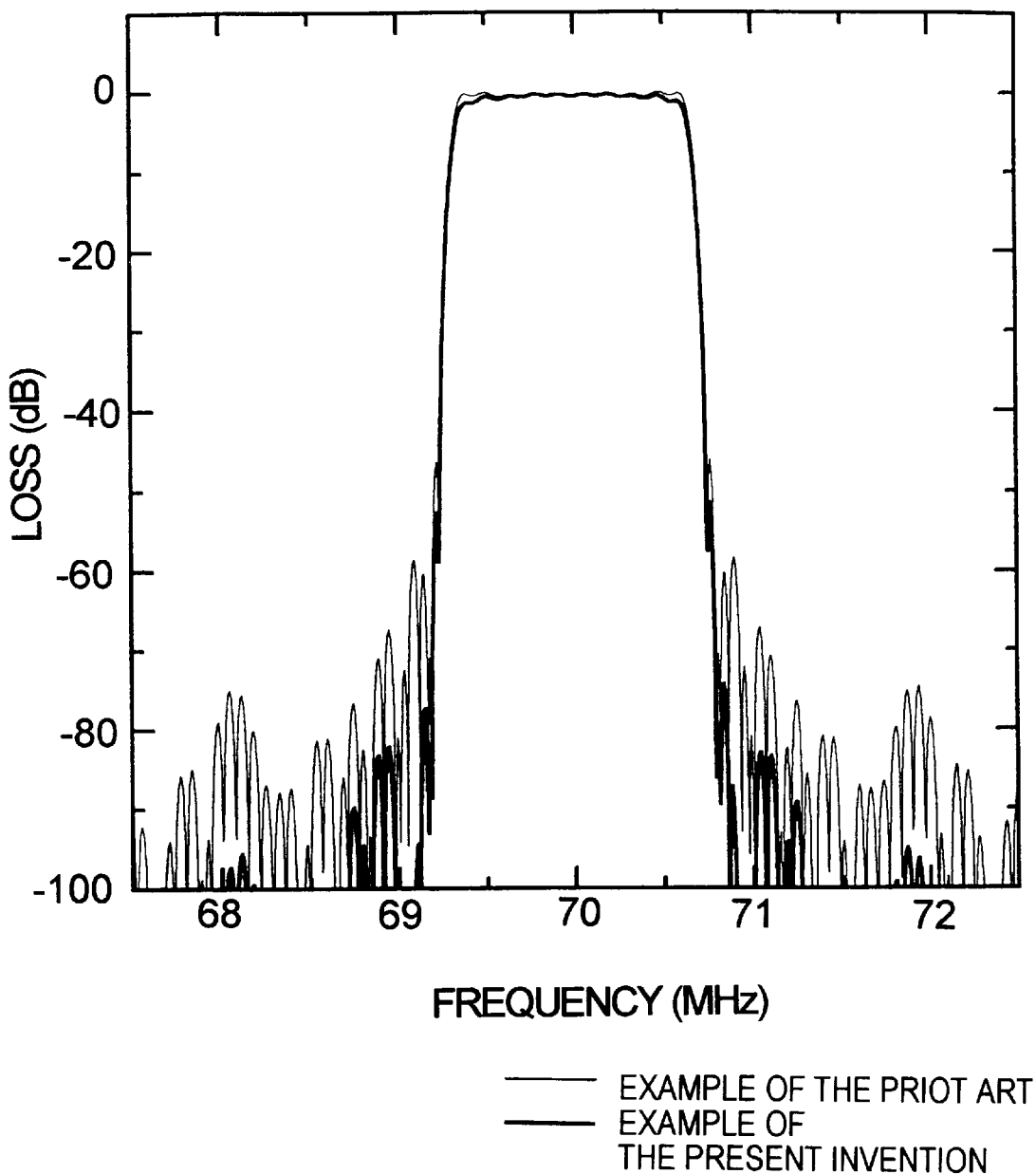
FIG. 13 is a graph showing frequency characteristics of the surface acoustic wave filter of FIG. 12.

FIG. 13 is a graph showing frequency characteristics of the SAW filter of FIG. 12. In FIG. 13, a thin line shows a graph of a conventional construction, whereas a thick line shows a graph of the construction of FIG. 12 of the present invention. It is found that, in the construction of FIG. 12, the loss outside the passband has increased, showing an improvement.

Figure 14:
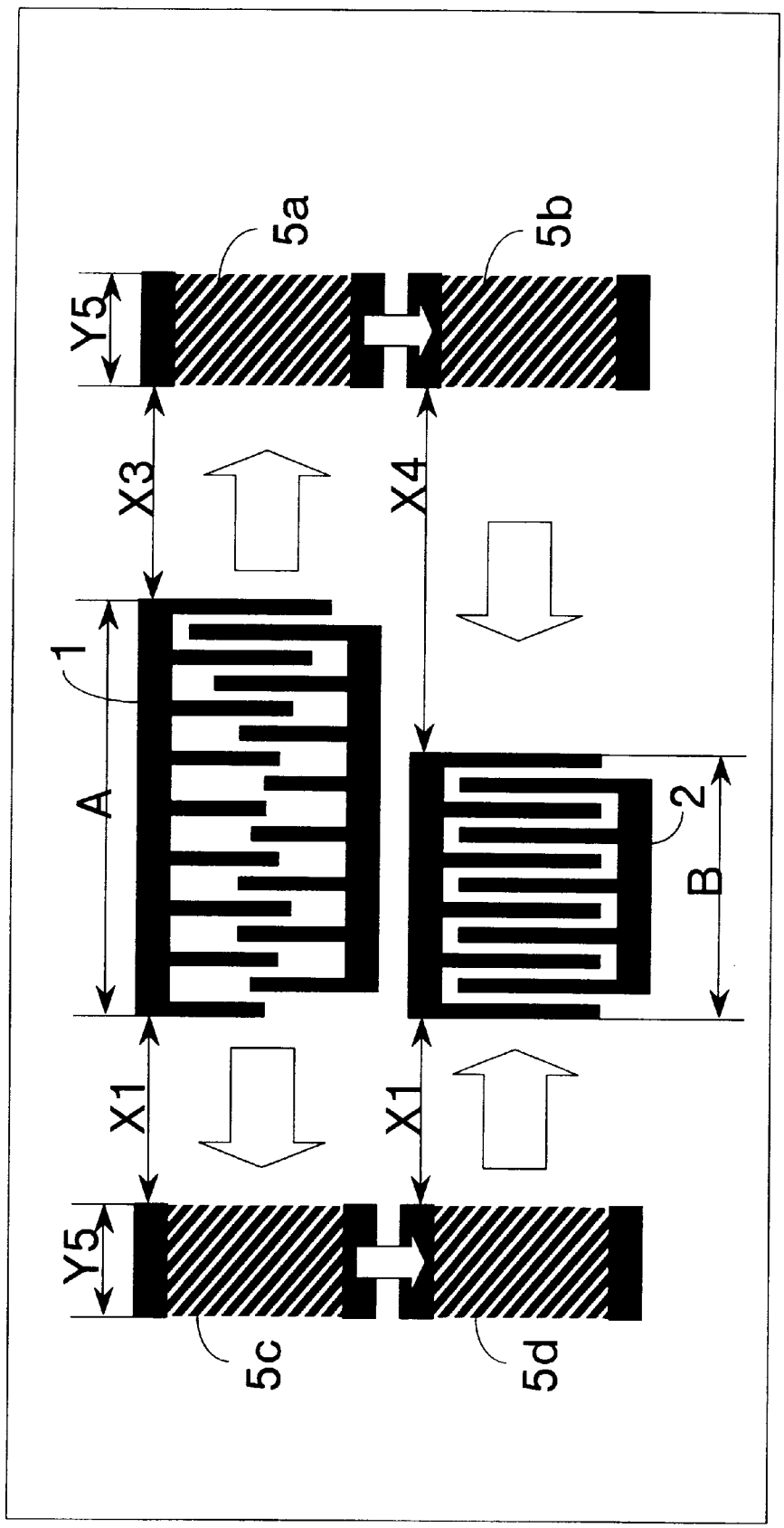
FIG. 14 is a view showing a construction of a surface acoustic wave filter according to one embodiment of the present invention in which an apodized IDT is used as an input IDT and a uniform IDT is used an output IDT.

FIG. 14 shows a construction of an embodiment of a SAW filter of the present invention in which an apodize IDT is used as the input IDT and a uniform IDT is used as the output IDT.

In FIG. 14, the input IDT 1 is an apodized IDT in which the number of electrode finger pairs is reduced. The input IDT 1 has a width of A=21915 μm in the right-and-left direction and the number of electrode finger pairs is reduced to about half (500 pairs) of the number of electrode finger pairs in an ordinary input IDT. The output IDT 2 is formed so that the output IDT 2 has a width B=2191.5 μm in the right-and-left direction and the number of electrode finger pairs is 50. Also, it is assumed that Y5=43.83×50 pairs= 2191.5 μm, and X1=1000 μm.

In this embodiment, if the filter is designed to satisfy the conditions A+2×X1=X3+X4 and X4−X3=A−B, the omitted portion of the SAWs oscillated by the input IDT can be reproduced by a synthesized wave form obtained at the output IDT, and further the width of the SAW filter in the right-and-left direction can be minimized. From the above two equations, it is found that X3=2095.75 μm and X4=21819.25 μm.

At this time, the width of the electrodes in the right-and-left direction in the SAW filter is Y5+X1+A+X3+Y5= 28393.75 μm. In a conventional SAW filter such as shown in FIG. 22, the width of the electrodes in the right-and-left direction is 2×A+X1+B=46021.5 μm.

Therefore, according to the construction of the present invention shown in FIG. 14, the size of the SAW filter can be reduced by 17627.75 μm as compared with the conventional filter.

Figure 15:
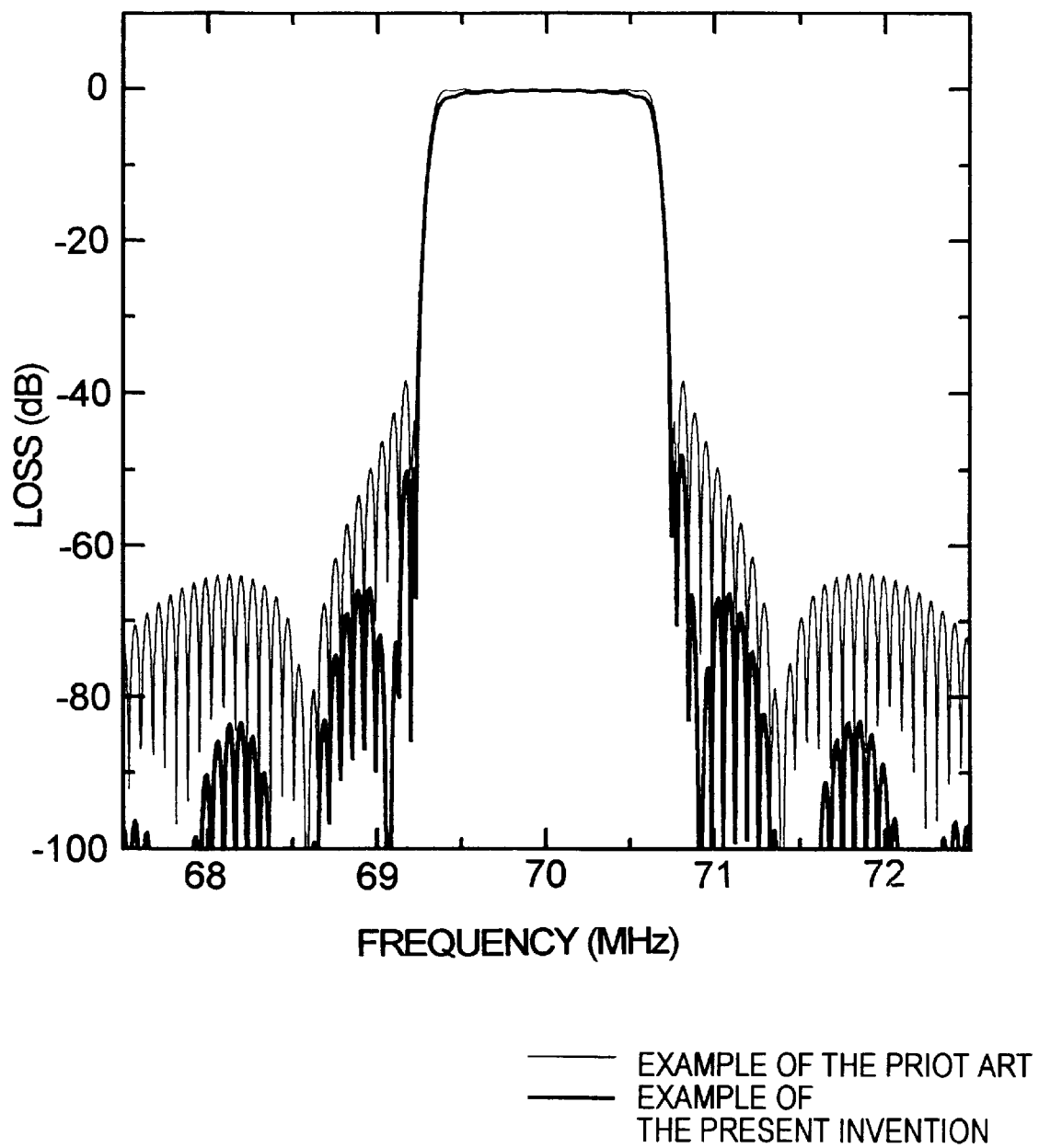
FIG. 15 is a graph showing frequency characteristics of the surface acoustic wave filter of FIG. 14.

FIG. 15 is a graph showing frequency characteristics of the SAW filter of FIG. 14. In FIG. 15, a thin line shows a graph of a conventional construction, whereas a thick line shows a graph of the construction of FIG. 14 of the present invention. It is found that, in the construction of FIG. 14, the loss outside the passband has increased, showing an improvement.

Figure 16:
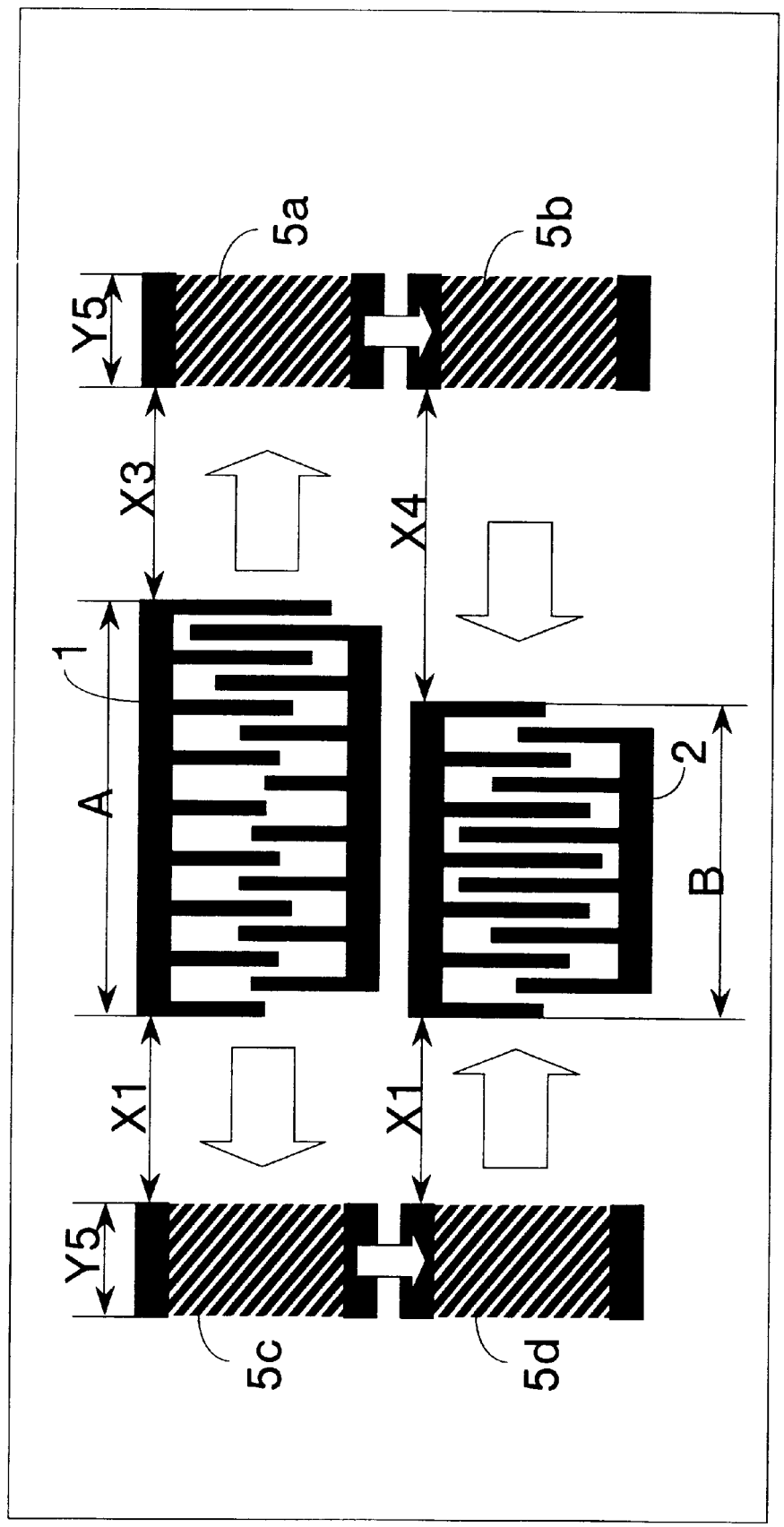
FIG. 16 is a view showing a construction of a surface acoustic wave filter according to one embodiment of the present invention in which apodized IDTs are used as an input IDT and as an output IDT.

FIG. 16 shows a construction of an embodiment of a SAW filter of the present invention in which apodized IDTs are used as the input IDT and as the output IDT.

In FIG. 16, the output IDT 2 is an ordinary apodized IDT which is conventionally used; whereas the input IDT 1 is an apodized IDT in which the number of electrode finger pairs is reduced. The input IDT 1 has a width of A=21915 μm in the right-and-left direction and the number of electrode finger pairs is reduced to about half (500 pairs) of the number of electrode finger pairs in an ordinary input IDT. The output IDT 2 is formed so that the output IDT 2 has a width B=15910.29 μm in the right-and-left direction and the number of electrode finger pairs is 363. Also, it is assumed that Y5=43.83×50 pairs=2191.5 μm, and X1=1000 μm.

In this embodiment, if the filter is designed to satisfy the conditions A+2×X1=X3+X4 and X4−X3=A−B, the omitted portion of the SAWs oscillated by the input IDT can be reproduced by a synthesized wave form obtained at the output IDT, and further the width of the SAW filter in the right-and-left direction can be minimized. From the above two equations, it is found that X3=8955.145 μm and X4=14959.855 μm.

At this time, the width of the electrodes in the right-and-left direction in the SAW filter is Y5+X1+A+X3+Y5= 36253.145 μm. In a conventional SAW filter such as shown in FIG. 22, the width of the electrodes in the right-and-left direction is 2×A+X1+B=60740.29 μm.

Therefore, according to the construction of the present invention shown in FIG. 16, the size of the SAW filter can be reduced by 24487.145 μm as compared with the conventional filter.

Figure 17:
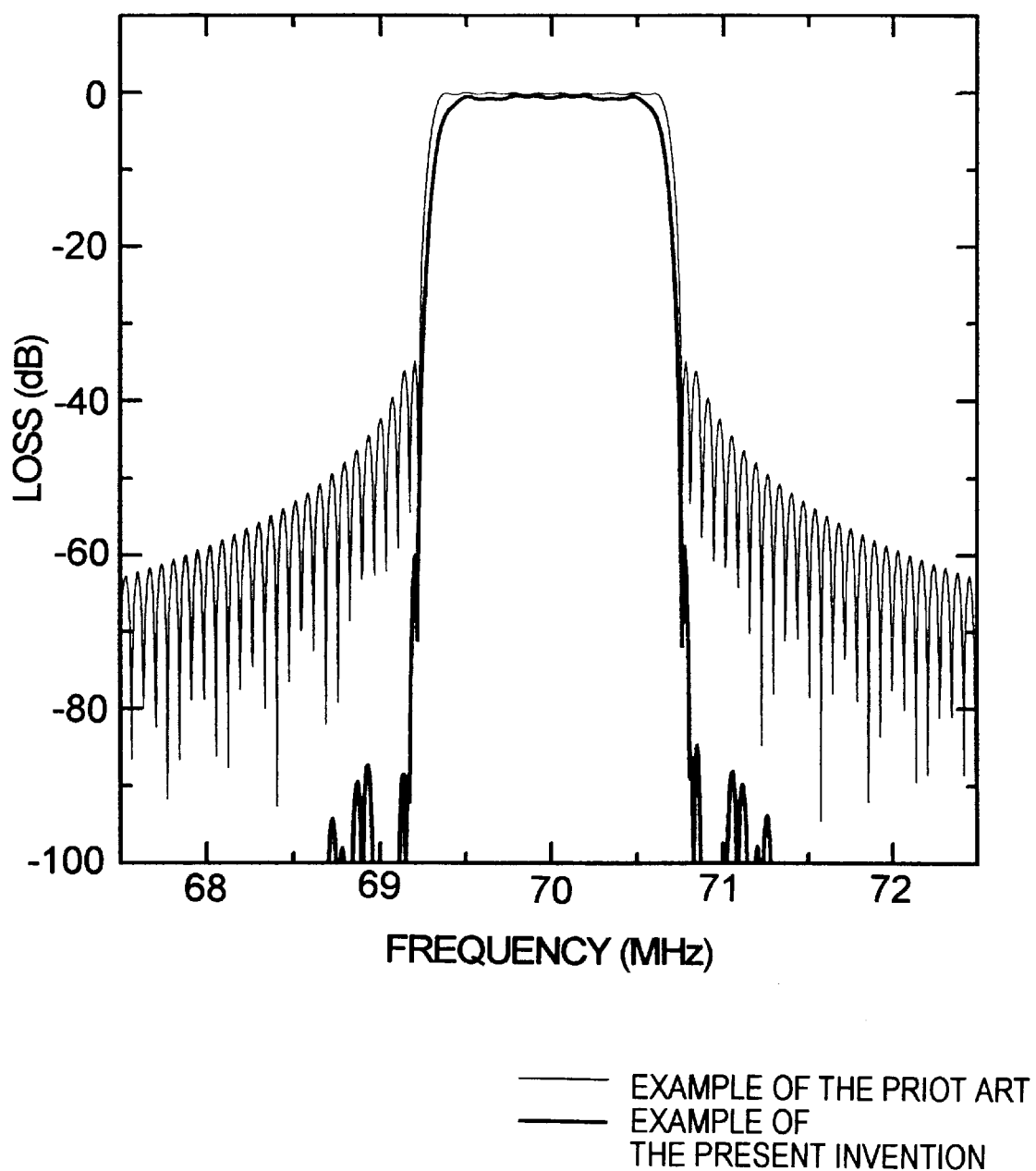
FIG. 17 is a graph showing frequency characteristics of the surface acoustic wave filter of FIG. 16.

FIG. 17 is a graph showing frequency characteristics of the SAW filter of FIG. 16. In FIG. 17, a thin line shows a graph of a conventional construction, whereas a thick line shows a graph of the construction of FIG. 16 of the present invention. It is found that, in the construction of FIG. 16, the loss outside the passband has increased, showing an improvement.

According to the present invention, the size of the SAW filter in the oscillation direction of the SAW oscillated by the input IDT can be reduced while maintaining the desired frequency characteristics of the SAW filter.

Also, according to the present invention, the frequency characteristics of the SAW filter can be improved (the loss outside the passband can be increased) by appropriately setting the construction of the input and output IDTs and the intervals between these IDTs and the first and second direction changing electrodes.

Further, according to the present invention, the adverse effects caused by the diffraction of the SAW on the frequency characteristics can be reduced by forming a grating electrode.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What we claim is:

1. A surface acoustic wave filter comprising:
    a piezoelectric substrate, at least one input IDT and at least one output IDT formed on the piezoelectric substrate, and
    first and second direction changing electrodes,
    wherein at least one of the input and output IDTs comprises a weighted interdigital transducer, the input and output IDTs being arranged in a direction perpendicular to a propagation direction of a surface acoustic wave oscillated by the input IDT;

the first direction changing electrode comprises an electrode disposed at left sides of the input and output IDTs for changing the propagation direction of the surface acoustic wave, which has propagated in a left direction from the input IDT, into a direction towards the output IDT;

the second direction changing electrode comprises an electrode disposed at right sides of the input and output IDTs for changing the propagation direction of the surface acoustic wave, which has propagated in a right direction from the input IDT, into a direction towards the output IDT;

the weighted interdigital transducer includes a portion of an electrode having a weighting means required for realizing desired frequency characteristics as a surface acoustic wave filter, the portion of the weighted interdigital transducer including a central portion which has the largest weighting means and comprising A% or more of the weighting means wherein $50 \leq A \leq 100$; and an interval between the input and output IDTs and the first and second direction changing electrodes is set for time-delaying the surface acoustic wave so that a surface acoustic wave to be generated by the electrode of the weighting means which has not been included in the weighted interdigital transducer is reproduced, and for obtaining at the output IDT the surface acoustic wave having the desired frequency characteristics.

2. The surface acoustic wave filter of claim 1, wherein each of the first and second direction changing electrodes comprises an interdigital transducer.

3. The surface acoustic wave filter of claim 1, wherein the first and second direction changing electrodes comprise two connected interdigital transducers arranged in two stages in a direction perpendicular to the propagation direction of the surface acoustic wave oscillated by the input IDT.

4. The surface acoustic wave filter of claim 1, wherein the first and second direction changing electrodes comprise first and second reflectors arranged in two stages in a direction perpendicular to the propagation direction of the surface acoustic wave oscillated by the input IDT, the first reflector changing the propagation direction of the surface acoustic wave, which has been emitted from the input IDT, into a direction towards the second reflector, the second reflector changing the propagation direction of the surface acoustic wave, which has been received from the first reflector, into a direction towards the output IDT.

5. The surface acoustic wave filter of claim 1, wherein an area defined by the interval between the input and output IDTs and the first and second direction changing electrodes comprises a free surface area.

6. The surface acoustic wave filter of claim 1, wherein a grating electrode comprising electrode fingers having a smaller periods than the input and output IDTs is formed in a passageway where the surface acoustic wave propagates in the area defined by the interval between the input and output IDTs and the first and second direction changing electrodes.

* * * * *